(12) United States Patent
Hastwell et al.

(10) Patent No.: US 8,431,344 B2
(45) Date of Patent: Apr. 30, 2013

(54) MICRO AND NANO SCALE FABRICATION AND MANUFACTURE BY SPATIALLY SELECTIVE DEPOSITION

(75) Inventors: Peter John Hastwell, North Adelaide (AU); Timothy Mark Kaethner, Crafers (AU)

(73) Assignee: Raustech Pty Ltd, South Australia (AU)

( * ) Notice: Subject to any disclaimer, the term of this patent is extended or adjusted under 35 U.S.C. 154(b) by 167 days.

(21) Appl. No.: 10/562,369

(22) PCT Filed: Jun. 30, 2004

(86) PCT No.: PCT/AU2004/000864
§ 371 (c)(1),
(2), (4) Date: Jul. 10, 2006

(87) PCT Pub. No.: WO2005/001120
PCT Pub. Date: Jan. 6, 2005

(65) Prior Publication Data
US 2007/0134930 A1    Jun. 14, 2007

(30) Foreign Application Priority Data

Jun. 30, 2003  (AU) ................................ 2003903298
Jun. 30, 2003  (AU) ................................ 2003903299

(51) Int. Cl.
*C12Q 1/68* (2006.01)
*H01L 21/469* (2006.01)
*B05D 3/00* (2006.01)
*G01N 1/28* (2006.01)

(52) U.S. Cl.
USPC .......... 435/6.11; 427/2.11; 438/758; 977/924

(58) Field of Classification Search ................. 435/6.11; 427/2.11; 438/758; 516/31; 977/924
See application file for complete search history.

(56) References Cited

U.S. PATENT DOCUMENTS

| | | | |
|---|---|---|---|
| 6,280,595 B1 * | 8/2001 | Montgomery | 205/122 |
| 6,350,609 B1 | 2/2002 | Morozov et al. | 435/283.1 |
| 2002/0094528 A1 | 7/2002 | Salafsky | 435/6 |
| 2002/0131147 A1 * | 9/2002 | Paolini et al. | 359/296 |
| 2004/0050701 A1 * | 3/2004 | McEntee et al. | 204/465 |
| 2004/0055892 A1 | 3/2004 | Oh et al. | |

FOREIGN PATENT DOCUMENTS

| | | |
|---|---|---|
| EP | 1 354 630 A1 | 10/2003 |
| GB | 1 008 101 A | 10/1965 |
| JP | 04-086602 | 3/1992 |
| WO | WO 00/13784 A1 | 3/2000 |
| WO | WO00/25936 | 5/2000 |
| WO | WO 03/002675 | 1/2003 |
| WO | WO 03/008088 A2 | 1/2003 |
| WO | WO 03/062456 A1 | 7/2003 |

OTHER PUBLICATIONS

Steward et al., "NanoXerography: The Use of Electrostatic Forces to Pattern Nanoparticles," Proceedings of the 2003 NSF Design, Service and Manufacturing Grantees and Research Conference, pp. 1-7.

* cited by examiner

Primary Examiner — Stephen Kapushoc
Assistant Examiner — Narayan Bhat
(74) Attorney, Agent, or Firm — Brinks Hofer Gilson & Lione

(57) ABSTRACT

A method of fabrication or manufacture at micrometer and nanometer scale by spatially selective deposition of chemical substances so as to form a solid phase array on a substrate (10) which includes the steps of defining a region (15) on the substrate by forming an electrostatic charge on that region which is different from the electrostatic charge on other regions of the substrate such as by formation of a latent electrostatic image thereon, applying an emulsion to the substrate. The emulsion (16) has an electrically charged discontinuous phase and a component to be selectively deposited carried in or comprising the discontinuous phase. The discontinuous phase of the emulsion is attracted to the preselected region by attraction by the electrostatic charge on the region and deposition obtained with or without reaction. The electrostatic image may be formed by the use of photoconductor. The array formed may be for flat screen display panels, for manufacture of DNA chips, printed circuits, semiconductor chips, nanotechnology, micro-electromechanical systems, flexible printed circuits or the like.

49 Claims, 7 Drawing Sheets

SEQUENCE LISTING

```
<160> NUMBER OF SEQ ID NOS: 2

<210> SEQ ID NO 1
<211> LENGTH: 12
<212> TYPE: DNA
<213> ORGANISM: Artificial
<220> FEATURE:
<223> OTHER INFORMATION: oligodeoxynucleotide (probe)

<400> SEQUENCE: 1
tttttttttt tt                                                        12

<210> SEQ ID NO 2
<211> LENGTH: 25
<212> TYPE: DNA
<213> ORGANISM: Artificial
<220> FEATURE:
<223> OTHER INFORMATION: oligodeoxynucleotide (probe)

<400> SEQUENCE: 2
tttttttttt tttttttttt ttttt                                          25
```

MICRO AND NANO SCALE FABRICATION AND MANUFACTURE BY SPATIALLY SELECTIVE DEPOSITION

This application is the national phase application of PCT/AU2004/000864, filed Jun. 30, 2004, which claims priority to both Australian Application No. 2003903298, filed Jun. 30, 2003, and Australian Application No. 2003903299, filed Jun. 30, 2003, the entireties of all of which are hereby incorporated by reference.

FIELD OF INVENTION

This invention relates to methods of fabrication and manufacture at micrometer and nanometer scale by spatially selective deposition with or without reaction of chemical substances.

BACKGROUND OF THE INVENTION

Commercial nanofabrication is currently limited by available technologies. Few allow manipulation in the nanometer range. The spatially selective deposition according to the present invention may be for the purpose of manufacture of solid phase arrays or other physical or chemical reactions such as manufacture of printed circuits, flat panel displays, semiconductor chips, nanotechnology, micro-electromechanical systems, flexible printed circuits, protein chips, lab-on-a-chip microfluidics and DNA chips.

In its broadest form the invention relates to the spatially defined deposition of any of a wide variety of chemical substances onto any predefined surface. Substances may include, but are not limited to, coloured materials, dyes, drugs, polymers, catalysts, anti-wetting agents, pigments, etching chemicals, conductors, metals such as gold, layerings and reagents for de-blocking, blocking, protecting and de-protecting, derivatisation and activation of solid phase chemical groups. Arrays can include pixel arrays for display panels, deoxyribonucleic acids (DNA), peptides, peptidenucleic acids (PNA), ribonucleic acids (RNA) and other solid phase chemical arrays and arrays assembled by combinatorial chemistry.

One form of the invention will be generally discussed in relation to manufacture of DNA arrays of the type generally known as DNA chips on substrates particularly planar substrates but the invention is not limited to that particular application but has wider ramifications and the invention is not intended to be limited to the manufacture of such DNA chips.

DNA chips (microarrays) are postage-stamp sized surfaces on which short segments of thousands of gene fragments (as single stranded DNA) are immobilized, of known sequence and in known locations. Because they are used to test for the presence of messenger RNAs and in tissue samples and/or for the level of expression of particular genes, these tethered DNA sequences (oligodeoxynucleotides) are called "probes".

In one form of use, to profile tissue samples from malignant tumours, scientists extract messenger molecules (mRNA) involved in implementing genetic instructions within the tumours, make DNA or RNA copies, termed targets, often with amplification, eg polymerase chain reaction (PCR), label these with fluorescent markers, and flood these targets across the DNA chip. DNA probes on the chip will hybridise to the labelled targets and fluoresce if the patient's tumour extract contains one or more fluorescently labelled molecules (genetic instructions) that match one or more of the probe sequences and hybridises to it.

The molecules that bind to probes are called "targets". Tissue samples containing a specific gene that is being more actively expressed with respect to a control, give rise to a probe cell that fluoresces more intensely when bound on the DNA chip than samples with little or no expression of that gene. The procedure is repeated with normal or reference tissue, and a computer then analyses the level of fluorescence to prepare a visual image comparing patterns of genetic activity in, for example malignant and normal tissue. In this manner it is possible to identify specific genes which are or may be involved in the malignancy, since specific zones, termed features of fluorescence can be related back to the segments (probes) of particular genes tethered in known locations on the DNA chip.

Selective de-protecting by direct light-activated chemistry or photo-removable de-protecting techniques has been developed but these are somewhat inefficient resulting in short impure solid phase oligodeoxynucleotides in rather large unit feature sizes of 10 to 50 microns. The applicant has surprisingly found that by the use of the present invention compositions which include the chemical de-protecting agent and which are selectively deposited on predefined areas of a planar or other shaped substrate under the influence of an electric field, then more accurate, localised and efficient de-protection may be possible. It is an object of this invention to provide a more efficient chemical de-protecting process.

Another form of the invention will be discussed with respect to manufacture of flat panel displays. In this form the invention relates to methods of making display devices using light emitting diodes (LEDs) such as polymer or organic light emitting diodes (OLEDs) as active layers. The method involves the direct deposition of LEDs or filters for LEDs such as patterned luminescent doped polymers and the fabrication of OLEDs and other semiconductor devices from these organic films.

There is increased interest in light emitting diodes made from organic polymers because of their potential low cost and potential applicability to colour flat panel displays. The organic materials are typically deposited by spin-coating (in the case of polymer materials), or by evaporation (in the case of small organic molecules). In either case, the single material covers the substrate so that only devices of a single colour can generally be fabricated. The straightforward integration of multiple organic layers (for the fabrication of red, green, and blue emitters as pixels for colour displays) requires the patterning of the individual organic layers using masks and screens. Because of their solubility in and sensitivity to aqueous solutions and many solvents, such patterning of organic materials by conventional photoresist and wet processing techniques is difficult. Efforts to date to integrate organic light emitting diodes with materials which emit different colours on the same substrate such as through the use of cathodes vapour-deposited through a shadow mask, such as dry-etch masks, have not been fully successful particularly for high resolution screens.

Different colours can be obtained in light emitting diodes by placing red, green and blue filter materials onto white LEDs or by placing red, green and blue emitting materials in proximity to each other using photoresist patterning and etching techniques to transfer the photoresist pattern into the polymer, however, such photoresist techniques are inapplicable to organic materials because the chemicals used for the photoresist process are incompatible with organic materials. Similarly, patterning subsequent layers on top of the organic materials (such as metal contacts) is difficult for the same reason. Vacuum deposited organic layers and metals may be patterned by vapour-depositing them through shadow masks, but this technology is difficult to extend to large areas and small pixel sizes with consequent registration problems.

An attractive feature of polymer or organic light emitting diodes is their very simple architecture. A basic device consists of an anode which is preferably indium tin oxide on a glass or plastic substrate, two thin polymer layers are then used, one of which is a polymer hole conducting layer (which can be a film of polyethylene dioxythiophene polystyrene sulphonate (PEDT/PSS) and the other of which is a conjugated polymer emissive layer. Then on the back a reflective cathode is provided. The whole device is then encapsulated to prevent the ingress of water. This invention in one form relates to the deposition in particular of one or more of these thin polymer layers.

There has been proposed the use of ink jet technology for the deposition of the polymer layers for OLEDs or the dyes for the polymers for OLEDs but there can be problems with this method of manufacture. This technology has problems with variable droplet size, satellite droplets, processing time, registration, droplet bounce and delivery restrictions. The viscosity of the OLED polymer "ink" is also limiting for the deposition of polymers.

Light emitting diode arrays may be passive or active matrix arrays. Passive arrays are powered directly by conductor arrays and active matrix arrays include single or poly-transistor switching to provide more even activation of the LEDs. This system uses switching conductor arrays and separate power supply for the LEDs. The method according to this invention may be applicable to either type of LED array but is particularly applicable to active matrix arrays.

It is an object of this invention to provide an alternative method of manufacture of multi-colour light emitting diode or light emitting polymer arrays for flat panel displays.

It is another object of the invention to provide a method for the spatially defined deposition of any of a wide variety of chemical substances onto any predefined surface.

BRIEF DESCRIPTION OF THE INVENTION

In one form the invention may be said to reside in a method of manufacture by micrometer and nanometer scale spatially selective deposition of chemical substances on a substrate, the method including the steps of:
(a) defining at least one region on the substrate by forming an electrostatic charge on the region which is different from the electrostatic charge on other regions of the substrate,
(b) applying an emulsion to the substrate, the emulsion having an electrically charged discontinuous phase and a component to be selectively deposited carried in or comprising the discontinuous phase, and
(c) directing the discontinuous phase of the emulsion to the at least one region by attraction to or repulsion from the electrostatic charge on the region.

The process may further include the step of carrying out repetition of steps (a) to (c) to provide a stepwise deposition process at the same or alternative positions on the substrate.

In a further form the invention may be said to reside in a method of manufacture by micrometer and nanometer scale spatially selective deposition of chemical substances on a substrate, the method including the steps of:
(a) defining at least one region on the substrate by forming an electrostatic charge on that region which is different from the electrostatic charge on other regions of the substrate such as by formation of a latent electrostatic image thereon,
(b) applying an emulsion to the substrate, the emulsion having an electrically charged discontinuous phase and a chemical reagent to participate in forming the solid phase array carried in or comprising the discontinuous phase,
(c) depositing the discontinuous phase of the emulsion to the at least one region by attraction by the electrostatic charge on the region and optionally by the use of bias voltage to reduce deposition in non-required regions,
(d) causing a chemical or physical reaction in the at least one region, and
(e) removing the emulsion.

The process may further include the step of carrying out repetition of steps (a) to (e) to provide a stepwise deposition process at the same or alternative positions on the substrate.

Alternatively the process may include a further reaction step where the substrate is "flooded" with a further reagent wherein reaction only occurs where the spatially selective deposition has previously occurred.

In one embodiment of the invention the chemical reagent carried in the discontinuous phase may comprise an activated nucleoside amidite (A, C, G or T) and hence the step of causing a chemical reaction may include the step of directly depositing a nucleoside onto selected regions of a deprotected substrate. Alternatively the chemical reagent carried in the discontinuous phase may comprise an activated oligonucleotide and hence the step of causing a chemical reaction may include the step of directly depositing an oligonucleotide onto selected regions of a deprotected substrate.

The electrically charged emulsion may have a negative or a positive charge on it. The electrostatic charge pattern is normally a pattern of electrons. Deposition may be to those portions with a negative charge when the emulsion has a positive charge and to those portions without the negative charge where the emulsion is negatively charged.

Deposition may be done with the assistance of a bias voltage. A bias voltage may be supplied by the use of a bias plate which a selected distance above the substrate and a voltage (1 to 100V) applied to the bias plate. The voltage of the bias voltage needed can depend upon the distance of the substrate from the bias plate, the original level of electrostatic charge and the residual level of electrostatic charge. The voltage applied to the bias plate can be negative or positive. Bias voltage is used to prevent deposition in unwanted regions, to control the density of deposition and to assist with reversal deposition. Where the emulsion droplets are positively charged the use of a positive voltage on the bias plate may assist with reduction of deposition at unwanted regions of the substrate surface. Where the emulsion droplets are negatively charged the use of a negative voltage on the bias plate will assist with deposition at non-negatively charged regions of the substrate surface.

In general the manufacture of DNA chips, a form of solid phase chemical array, involves the selective and sequential addition onto a substrate, of molecular units each with a protective group which is removed when the next molecular unit is to be added. One such method of manufacturing DNA arrays uses a process known as the phosphoramidite process which uses a trityl group or derivatives of the trityl group as the protective group, termed a protecting group. The invention is not limited to this process but will be discussed with respect to it.

The phosphoramidite process is a repetitive four stage process (deprotection, coupling, capping and oxidation) for the chemical synthesis of polymers particularly sequences of DNA oligonucleotides to form portions of DNA.

In the phosphoramidite process, a portion of DNA in single stranded form is built up by the sequential addition of one of the four nucleotides (in phosphoramidite form) being the four components which make up DNA, the A, T, G and C nucleotides. Each nucleotide has a chemically removable protecting group on it. A chemical reagent known as a de-protecting agent removes the protecting group exposing a reactive hydroxyl group and in the next stage a nucleoside (in activated phosphoramidite form) is coupled to the growing DNA string at the reactive hydroxyl group. The next stage is a capping step where any DNA strings which were de-protected but to which a nucleotide was not coupled are permanently capped to prevent unwanted nucleotides from adding to that molecule in later coupling steps. In the final step, oxidation of the newly formed inter-nucleoside phosphite linkage is carried out to convert the linkage to a phosphotriester.

In the manufacture of DNA arrays, a number of different sequence DNA strands are built up on a substrate to enable biochemical analysis to take place. In this process it is necessary to selectively de-protect various portions of the array, termed features or cells, and it is particularly to the requirement for this selective de-protecting that one particular embodiment of the present invention is directed.

In another form the invention may be said to reside in a method of forming a solid phase chemical array on a substrate using a stepwise reaction process, the method including the steps of:
(f) defining at least one region on the substrate by forming an electrostatic charge on that region which is different from the electrostatic charge on other regions of the substrate such as by formation of a latent electrostatic image thereon,
(g) applying an emulsion to the substrate, the emulsion having the electrically charged discontinuous phase droplets and a chemical reagent carried in or comprising the discontinuous phase,
(h) depositing the discontinuous phase of the emulsion to the at least one region by attraction by the electrostatic charge on the region and optionally by the use of a bias voltage to reduce deposition in non-required regions,
(i) causing a chemical reaction in the at least one region,
(j) removing the emulsion, and
(k) carrying out subsequent steps of the stepwise reaction process.

In a preferred form of the invention the step of applying the emulsion to the substrate can include the step of applying a coating to the substrate the liquid of the continuous phase or another liquid before applying the emulsion. This can be advantageous because it may help to prevent extraneous deposition in non-desired regions.

In an alternative embodiment it may be used in a method of forming a DNA array on the substrate using a stepwise coupling process with a chemical de-protecting step prior to each coupling step, the method including the steps of:
(l) preparing a substrate with surface functional groups protected by a removable protecting group;
(m) defining at least one region on the substrate by forming an electric field on that region which is different from the electric field on other regions of the substrate such as by formation of an electrostatic image thereon,
(n) applying an emulsion to the substrate, the emulsion having the electrically charged discontinuous phase droplets and a chemical de-protecting reagent carried in the discontinuous phase as discussed above,
(o) depositing the discontinuous phase of the emulsion to the at least one region by attraction by the electric field on the region and optionally by the use of a bias voltage to reduce deposition in non-required regions,
(p) causing chemical de-protection in the at least one region,
(q) removing the emulsion, and
(r) carrying out subsequent steps of the stepwise coupling process.

The subsequent steps of the stepwise coupling process may be such as those that are carried out in the standard phosphoramidite chemistry for synthesis of oligodeoxynucleotides although as discussed earlier the invention is not limited to this particular chemistry.

It will be realised that the process as discussed above may be repeated a sufficient number of times to synthesise selected oligonucleotides of any sequence and length at least up to 100-mer in a predetermined spatial order, position, DNA density and feature size on the substrate.

The substrate may include a support, a conductive layer on the support, a dielectric or photoconductive layer of a material which will hold an electric charge and a chemically functional layer. The support may be selected from a metal, glass, ceramic, or polymeric material and the support can be either clear or opaque and either flexible or rigid. In a preferred embodiment the support may be combined with the conductive layer. The conductive layer may be a very thin layer and may be transparent. The conductive layer may be vacuum-deposited onto the support. The conductive layer may be selected from a sputtered layer of metal or indium tin oxide. The dielectric or photoconductive layer may be an active layer and the charge on this layer may be influenced by radiation selected from infrared, visible, ultraviolet or X-ray. The dielectric or photoconductive layer may be of a material which is adapted to have a charge pattern formed thereon by selective discharging an already charged surface upon incident radiation impinging thereon. The already charged surface on the substrate may be provided by a corona discharge, electron beam gun, donor roller or the like. Alternatively the dielectric layer may be chargeable by processes such as soft lithography.

The dielectric layer may be glass or a polymeric resin such as methylmethacrylate (MMA) or the like. Where the dielectric layer is a photoconductor the material of the layer may be selected from zinc oxide, cadmium sulphide, amorphous selenium, alloys of selenium such as selenium-tellurium, lead selenide, selenium-arsenic, and the like. Additionally, there can be selected as photoresponsive imaging members various organic photoconductive materials including, for example, polyvinylcarbazole (PVK) or complexes of trinitrofluorenone and PVK. There are also disclosed layered organic photoresponsive devices with aryl amine hole transporting molecules, and photogenerating layers, reference U.S. Pat. No. 4,265,990, the disclosure of which is totally incorporated herein by reference.

The chemically functional layer may be adapted to prevent reaction or access between the liquids or reagents carried in the emulsion and other liquids used in the process and components of the dielectric or photoconductive layer. Alternatively or in addition the chemically functional layer may be a reactive material which allows a chemical reaction with another compound at its surface to form a derivatised or functionalised surface for subsequent reaction such as with linker molecules. Alternatively the chemically functional layer may be intrinsically reactive.

The chemically functional layer may be formed from a silane, silicon dioxide, silicon nitride ($Si_xN_y$), titanium dioxide, Tyzor™, cross-linked or partially cross-linked epoxy novolac resin, polymerised oligomers, cross-linked resins, functionalised parylene (a polymer of di-para-xylyene with one or more functional groups), acrylates and methacrylates which may include functional groups, multi-acrylate and methacrylate monomers, monomers which have been cross-linked with a photo-initiator and the like. Multi-acrylate and methacrylate monomers refers to monomers with a plurality of double bonds. The functional group may be an active ester, epoxy, aromatic, acid, aliphatic and hydroxyl or the like.

Formation of the chemically functional layer may be achieved using several processes, including immersion of the substrate in reactive chemicals, "painting", dip-coating, spin-coating, vacuum deposition and vapour phase deposition, wherein the chemically functional layer becomes attached by covalent bonding or by other attractive forces after solvent evaporation or curing of resins by heating or irradiation e.g., with UV light, or by treatment with peroxides or catalysts or by free radical mechanisms. Such layers may be formed either in air or under an inert atmosphere such as nitrogen.

The step of depositing at least one region may include the step of reversal deposition to enable deposition in non-charged regions.

The formation of the electrostatic image pattern may be by electrostatic means such as where the substrate is a photoconductor and the formation of the electrostatic field is by charging and subsequent selective discharging, for example by selective illumination. Preferably in the manufacture of DNA arrays the illumination may not include radiation in the short ultraviolet region as this may cause damage to the DNA molecule. For the assembly of other chemical chips or arrays, however, UV radiation may be used.

The step of removing the emulsion may include the step of neutralising any residual chemical de-capping agent in the emulsion to prevent it from reacting in non-desired parts of the array and washing of the surface.

As discussed above, the emulsion for use in one embodiment of the present invention comprises an electrically insulative continuous phase such as a fluorochemical, an aqueous or a non-aqueous discontinuous phase for instance a hydrocarbon oil which carries the chemical de-capping agent in it in solution, with preferably a surfactant and preferably a charge control agent.

Where the discontinuous phase is a hydrocarbon oil, the chemical de-protecting agent may be a strong protic, organic or inorganic acid.

The chemical de-protecting agent may be a Lewis acid or a protic acid. The Lewis acid may be selected from but not restricted to zinc bromide, titanium tetrachloride, and ceric ammonium nitrate while dilute protic acids which can be used include, but are not limited to, dilute mineral acids, trichloroacetic acid (TCA), dichloroacetic acid (DCA), benzenesulphonic acid, trifluoroacetic acid (TFA), difluoroacetic acid, perchloric acid, orthophosphoric acid and toluenesulphonic acid. Other acids may include dodecylbenzene sulphonic acid, dinonylnaphthyldisulphonic acid (DNNDSA), dinonylnaphthylsulphonic acid (DNNSA), perfluorooctanoic acid (PFOA) and diphenyl acid phosphate.

An emulsion suitable for the present invention may include a continuous phase, a discontinuous phase which is immiscible in the continuous phase, and a surfactant, the surfactant having a first part which is compatible with the continuous phase and a second part which is compatible with the discontinuous phase, characterised by the continuous phase having a high volume resistivity, the discontinuous phase including a selected chemical reagent and being electrically charged and the surfactant being selected to not significantly reduce the volume resistivity of the continuous phase.

The term "not significantly reduce the volume resistivity" is intended to mean that the volume resistivity of the continuous phase of the emulsion is not reduced to such an extent that the electrical charge on the substrate or discontinuous phase is ineffective. In such a situation the discontinuous phase may not deposit patternwise under the influence of an electric field.

It may be noted, too, that the choice of discontinuous phase or any of its components should be such that it does not significantly partition into the continuous phase and thereby neither significantly reduce the volume resistivity of the continuous phase nor impart chemical reactivity to the continuous phase.

Preferably the surfactant is one which has a first part which is compatible with the continuous phase and a second part which is compatible with the discontinuous phase. Hence it may be selected so as to have analogues of the principal components of the continuous phase and the discontinuous phase.

The surfactant may be selected from anionic, cationic, non-ionic or amphoteric, compounds, polymer surfactant materials or phospholipids.

For instance the surfactant may be alcohol/fatty acid esters, alkoxylated castor oils, alkyl phenol ethoxylates, ethoxylated alcohols, sorbitan esters, glycerine esters, polyethylene glycols and phospholipids.

As discussed above the continuous phase is comprised of a liquid which is electrically insulative and although the characteristics of a particular system would have to be determined empirically it is expected that such a liquid would preferably have a volume resistivity of at least $1 \times 10^6$ ohm-cm.

The continuous phase may be selected from hydrocarbons such as hexane, naphthalenes, decalin, cyclohexane, iso-octane, heptane, aromatic hydrocarbons and isodecane and commercially available mixtures of hydrocarbons such as the Isopars™ and Norpars™ made by Exxon. The continuous phase may also be selected from fluorochemicals including fluorocarbon compounds. These fluorochemicals generally comprise from 2 to 16 carbon atoms and include, but are not limited to, linear, cyclic or polycyclic perfluoroalkanes, bis (perfluoroalkyl)alkenes, perfluoroethers, perfluoroalkylamines, perfluoroalkyl bromides and perfluoroalkyl chlorides such as the Fluorinerts™ made by 3M. The continuous phase may also be selected from silicone fluids such as polyphenylmethyl siloxanes, dimethyl polysiloxanes, polydimethyl siloxanes, cyclic dimethyl siloxanes and the like. The use of fluorochemicals in the process of the present invention may provide significant advantages as these compounds do not absorb water where this characteristic is desirable.

The continuous phase may also be a gel or highly viscous liquid.

The discontinuous phase should be inmmiscible with, substantially insoluble in or not partition into the continuous phase.

The discontinuous phase may be aqueous or non-aqueous.

The non-aqueous discontinuous phase which carries the chemical de-protecting agent in solution may be selected from acetone, acetonitrile, cyclohexanone, dibromomethane, dichloromethane (methylene chloride, DCM), trichloromethane, dimethyl formamide (DMF), dioxane, 1,2-dichloroethane (DCE), nitromethane, tetrahydrofuran, toluene, dimethyl formamide, isobutanol, propylene carbonate, dimethyl sulphoxide, commercially available mixtures of hydrocarbons including Isopar™ and Norpar™ or mixtures of compounds such as isopropanol/methylene chloride, nitromethane/methanol, nitromethane/isopropanol, trichloromethane/methanol or isopropanol/methylene chloride. Other hydrocarbons such as decalin may also be used.

The discontinuous phase may be a reagent such as a chemical de-protecting agent or it may be a solvent which carries the active chemical reagent. Alternatively the active chemical reagent may be a solid or insoluble liquid dispersed in the discontinuous phase.

The emulsions according to the invention may also include charge control agents.

The charge control agent may be selected so as to have analogues of the principal components of the continuous phase and the discontinuous phase. For instance where the continuous phase is a fluorochemical the charge control agent may include a fluorine analogue of the compounds listed below.

In some embodiments the function of the charge control agent may be provided by the surfactant or may be intrinsic to the emulsion droplets carrying a chemical substance, eg an acid for de-protection.

The charge control agent may be an acid and its salts, an organic acid and its salts or an ionic or zwitterionic compound.

The charge control agents may be selected from metallic soaps wherein the metals include: barium, calcium, magnesium, strontium, zinc, cadmium, aluminium, gallium, lead, chromium, manganese, iron, nickel, zirconium and cobalt and the acid portion is provided by a carboxylic acid, e.g., caproic acid, octanoic (caprylic) acid, capric acid, lauric acid, myristic acid, palmitic acid, stearic acid, oleic acid, linolic acid, erucic acid, tallitic acid, resinic acid, naphthenic acid, succinic acid and the like. Examples of metallic soaps include: aluminium tristearate, aluminium distearate, barium, calcium, lead and zinc stearates; cobalt, manganese, lead and zinc linoleates; aluminium, calcium and cobalt octoates; calcium and cobalt oleates; zinc palmitate; calcium, cobalt, manganese, lead and zinc naphthenates; calcium, cobalt, manganese, lead and zinc resinates, petronates and the like. The charge control agent may also be a phospholipid such as lecithin or alkyl succinimide.

The chemical reagent in the discontinuous phase may be a bio-active agent, an activated nucleoside amidite (A, C, G or T), an activated oligonucleotide, a reagent or reactant including an acid or a base, a blocking chemical, a de-blocking chemical, an organic or inorganic derivatisation chemical, a catalyst, a pharmaceutical, a dye or a pigment.

An emulsion according to this invention may have a continuous phase which is present in the range of about 20 to 99.99 percent by volume, a discontinuous phase which is present in a range of from about 0.01 to 80 percent by volume, optionally a surfactant which is present in a range of about 0.1 to 35 percent by weight and optionally a charge control agent which is present in a range of 0.01 to 10 percent by weight.

Throughout this specification the term emulsions is used to indicate emulsions, mini-emulsions and microemulsions. Hence the emulsions according to this invention may be true emulsions, that is, emulsions which are formed by the input of mechanical energy such as by shaking, stirring, high shear or the like. Alternatively the emulsions may be mini-emulsions which form with the application of more energy than for a standard emulsion. Alternatively the emulsions may be microemulsions which form substantially spontaneously provided the correct conditions of temperature and chemical composition are present. Emulsions may have a droplet size of from about 100 microns down to 0.2 microns, mini-emulsions may have a droplet size from 500 nanometers down to about 50 nanometers and micro-emulsions may have droplet sizes of from about 200 nanometers down to 1 nanometer. It will be noted that there is no hard and fast rule on the size ranges for each. Size ranges will depend upon the composition of each of the phases and the type and quantity of surfactant used. The energy applied by the emulsification equipment may also influence size ranges. Temperature and pressure may also affect droplet size range.

The term droplet is intended to refer to the various morphological forms of the discontinuous phase in an emulsion. It may include shapes other than spherical for instance cubic, cylindrical and lamellar.

An emulsion according to the present invention may also include emulsion of the type known as Pickering emulsions. These emulsions are systems of a continuous phase, a finely dispersed discontinuous phase and at least one type of microfine particulate which has an average particle size of less than 200 nm and which displays amphiphilic character. The microfine particles may be selected from alumina, bentonite, magnesium aluminium silicate, fat crystals, magnesium oxide, magnesium trisilicate, titanium dioxide, treated fumed silica, silica and tin oxide. The stability of Pickering emulsions depends upon wetting contact angle, particle size, particle concentration, interparticulate interaction and viscosity.

For this invention the particles or droplets of emulsion may range in size from 100 microns downwards depending upon the type of emulsion and the applications to which the emulsion is to be applied. Preferably in the case of emulsions for chemical de-protecting in the phosphoramidite process the emulsions may have a size range from 50 microns down to 20 nanometers.

It will be seen that by the use of emulsions of the present invention the manufacture at micrometer and nanometer scale by spatially selective deposition of chemical substances will be possible because of the sizes of the droplets in the emulsions and their ability to carry deposition materials or reagents to selected sites.

Although the mechanism of charging of the emulsion droplets is not fully understood applicants believe that it relates to accumulation of polar or ionic species at the interface between the continuous and discontinuous phases. Electrostatic charging of the emulsions has been noted both with and without the use of charge control agents and surfactants.

The electrical charge on the droplets of the discontinuous phase of the emulsions according to the present invention may be positive or negative. Applicant has produced both depending upon the compositions selected.

Preferably where the continuous phase of the emulsion is a fluorochemical the fluorochemical is a perfluorocarbon such as perfluorooctanate, linear, cyclic or polycyclic perfluoroalkanes, bis(perfluoroalkyl)alkenes, perfluoroethers, perfluoroalkylamines, perfluoroalkyl bromides and perfluoroalkyl chlorides.

The continuous phase may alternatively be a silicone fluid or an organic liquid, such as a hydrocarbon oil selected from hexane, cyclohexane, iso-octane, heptane, decalin, naphthalenes, aromatic hydrocarbons and isodecane and commercially available mixtures of hydrocarbons such as the Isopars™ and Norpars™ made by Exxon.

In one embodiment the continuous phase may be supercritical carbon dioxide ($cCO_2$). This liquid has the property of being compatible with fluorinated surfactants.

Preferably where the continuous phase is a fluorochemical the surfactant is a fluorochemical having a fluorophilic part and a part which is compatible with the discontinuous phase such as a lipophilic part. These compounds may also be referred to as amphiphiles. Examples of these are perfluorocarbon-propoxypropylene, fluoro-alkyl citrate, perfluoroalkyl-alkylene mono- or di- morpholinophosphate and fluorinated phospholipids, alcohols, polyols or polyhydroxylated or aminated derivatives including amine oxides, amino acid derivatives and fluorinated analogues of AOT (1,4 bis (2-ethylhexyl) sulphosuccinate).

The fluorinated surfactants may also be associated with hydrophobic, non-ionic, anionic, cationic or zwitterionic moieties. Such moieties include, for example, phospholipids, copolymers of the polyoxyethylene polyoxyethylenepolyoxypropylene type and polyoxyethylene sorbitan esters.

The surfactants for the emulsion where the discontinuous phase is water may be selected from non-ionic, anionic, cationic or zwitterionic surfactants.

There may also be used combinations of the various surfactants discussed above.

As discussed above it may be noted that the emulsions according to this embodiment of the invention may be true emulsions or mini-emulsions, that is, emulsions which are formed by the input of mechanical energy such as by shaking, stirring or the like. Alternatively the emulsions may be microemulsions which form substantially spontaneously provided the correct conditions of temperature and chemical composition are present.

Alternatively the fluorochemical of this embodiment may be replaced by an alternative compound such as a silicone fluid and hence the surfactant would be selected from a compound which had a silicophilic part.

In an alternative form the invention is said to reside in a method of manufacturing a flat screen display of the type having separately illuminable pixels, the method including the steps of;
i) providing a substrate having a light emitting diode array defining a plurality of pixel sites, each pixel site including an electrode;
ii) applying an electric charge to the electrodes of selected pixel sites,
iii) providing a liquid composition adapted to apply a colourant, the liquid composition including an insulative liquid and electrically charged colourant of a selected colour;
iv) placing the liquid composition onto the substrate;
v) attracting the colourant to the selected pixel sites;
vi) removing excess liquid composition from the substrate;
vii) fixing the colourant to the substrate; and
vii) repeating steps ii) to viii) to apply further colourant of other selected colours to other selected pixel sites.

Preferably the selected colour includes the colours red, green and blue.

Preferably the charge is applied to the selected pixel sites by activating selected ones of the LED array.

In one form of the invention the light emitting diodes may be organic light emitting diodes.

Preferably the insulative liquid is selected from hydrocarbon fluids, silicone fluids, chlorinated hydrocarbons and perfluorocarbons.

Preferably the colourant is or is incorporated in charged droplets being the discontinuous phase of an emulsion. The colourant may comprise an active resin and a pigment or dye.

Hence the emulsion of one form of the invention comprises the insulative liquid as a continuous phase and a liquid discontinuous phase which is immiscible with the continuous phase, the liquid of the discontinuous phase comprising or including the colourant which may be a pigment or dye.

The substrate may be selected from glass, polyester foil, polycarbonate, Mylar™, stainless steel and the like.

The substrate can include a coating of indium tin oxide (ITO) and this ITO coating can be patterned into an array of electrodes.

In an alternative form the invention is said to reside in a method of manufacturing a flat screen display of the type having separately illuminable pixels, the method including the steps of;
i) providing a substrate having a conductor array defining a plurality of pixel sites, each pixel site including an electrode;
ii) applying an electric charge to the electrodes of selected pixel sites,
iii) providing a liquid composition adapted to apply a selected polymer film to the selected pixel sites, the liquid composition comprising an emulsion including a continuous phase comprising an insulative liquid and a discontinuous phase comprising electrically charged droplets of or including a polymer to deposit the polymer film;
iv) placing the liquid composition onto the substrate;
v) attracting the droplets to the selected pixel sites;
vi) removing excess liquid composition from the substrate;
vii) fixing the polymer to the substrate; and
viii) repeating steps ii) to viii) to apply further selected polymer film to other selected pixel sites.

The polymer may be any material which exhibits electroluminescence such as poly(phenylene vinylene) (PPV), parylene, polyvinylcarbazole (PVK) and polyfluorene. These materials may also be known as light emitting polymers (LEPs).

The polymer film can include sensitisers to provide red, green and blue organic light emitting diodes.

Preferably the charge is applied to the selected pixel sites by activating selected ones of the conductor array.

Preferably the insulative liquid is selected from hydrocarbon fluids, silicone fluids and perfluorocarbons and the substrate is selected from glass, polyester foil, polycarbonate, Mylar or stainless steel. Where the substrate is not a conductor and the function of a conductor is needed for one of the electrodes of a LED then the substrate can include a coating of indium tin oxide (ITO).

In a still further form the invention is said to reside in a method of manufacturing a flat screen display of the type having separately illuminable pixels, the method including the steps of;
i) providing a substrate having a conductor array defining a plurality of pixel sites, each pixel site including an electrode;
ii) applying an electric charge to all of the electrodes of the plurality of pixel sites,
iii) providing a liquid composition adapted to apply a selected polymer film to the selected pixel sites, the liquid composition comprising an emulsion including a continuous phase comprising an insulative liquid and a discontinuous phase comprising electrically charged droplets of or including a polymer to deposit the polymer film;
iv) placing the liquid composition onto the substrate;
v) attracting the charged droplets to the selected pixel sites;
vi) removing excess liquid composition from the substrate;
vii) fixing the polymer to the substrate;
viii) applying an electric charge to selected ones of the electrodes of the plurality of pixel sites,
ix) providing a second liquid composition adapted to apply a dye to the selected pixel sites, the second liquid composition comprising an emulsion including a continuous phase comprising an insulative liquid and a discontinuous phase comprising electrically charged droplets of or including the dye to deposit onto the polymer film;
x) placing the second liquid composition onto the substrate;
xi) attracting the charged droplets to the selected pixel sites;
xii) removing excess liquid composition from the substrate;

xiii) fixing the polymer to the substrate; and xiv) repeating steps viii) to xiii) to apply further selected dye to other selected pixel sites.

The polymer is preferably polyvinylcarbazole (PVK) and the dye is selected from coumarin 7, coumarin 47 and nile red.

Preferably the charge is applied to the selected pixel sites by activating selected ones of the conductor array.

Preferably the insulative liquid is selected from hydrocarbon fluids, silicone fluids and perfluorocarbons.

Preferably the substrate is selected from glass, polyester foil, polycarbonate, Mylar (PET, polyethyleneterephthalate) and stainless steel and may be flexible or rigid.

The electrodes may be highly reflective such as being silver to reflect light produced in the light emitting polymer forwards as much as possible.

In one form of the invention the polymer film fixed to the substrate is a photoconductor and step ix) is achieved by selective illumination of pixel sites. For instance the polymer polyvinylcarbazole (PVK) can be a photoconductor and may be charged and selectively discharged to enable electrostatic attraction of the charged emulsion droplets as required.

In an alternative form the invention is said to reside in a method of manufacturing a flat screen display of the type having separately illuminable pixels, the method including the steps of;

i) defining a plurality of pixel sites on a substrate by generating a electrostatic array pattern on the substrate;

ii) providing a liquid composition adapted to apply a selected polymer film to the defined pixel sites, the liquid composition comprising an emulsion including a continuous phase comprising an insulative liquid and a discontinuous phase comprising electrically charged droplets of or including a polymer to deposit the polymer film;

iii) placing the liquid composition onto the substrate;

iv) attracting the droplets to the defined the plurality of pixel sites;

v) removing excess liquid composition from the substrate;

vi) fixing the polymer to the substrate; and vii) repeating steps i) to vi) to apply further selected polymer film to other defined pixel sites.

The polymer film may be provided twice at each pixel site to generate an OLED. The first polymer may be one which provides a hole conducting layer (such as a film of polyethylene dioxythiophene polystyrene sulphonate (PEDT/PSS)) and the other polymer can be one which provides a conjugated polymer emissive layer. This latter polymer may be selected from any material which exhibits electroluminescence such as poly(phenylene vinylene) (PPV), parylene, polyvinylcarbazole (PVK), and polyfluorene. The order of deposition will be determined by whether the OLED is being deposited from the back to the front or from the front to the back. Preferably the hole conduction layer is in front of the emissive layer.

The emulsion used in any of these forms of the invention may include a continuous phase, a discontinuous phase which is immiscible in the continuous phase, and a surfactant, the surfactant having a first part which is compatible with the continuous phase and a second part which is compatible with the discontinuous phase, characterised by the continuous phase having a high volume resistivity, the discontinuous phase being electrically charged and the surfactant being selected to not significantly reduce the volume resistivity of the continuous phase.

As discussed above the continuous phase is comprised of a liquid which is electrically insulative and although the characteristics of a particular system would have to be determined empirically it is expected that such a liquid would preferably have a volume resistivity of approximately $1 \times 10^6$ ohm-cm or greater.

The continuous phase may be selected from hydrocarbons such as hexane, cyclohexane, iso-octane, heptane, aromatic hydrocarbons, decalin and isodecane and commercially available mixtures of hydrocarbons such as the Isopars™ and Norpars™ made by Exxon. The continuous phase may also be selected from fluorochemicals including fluorocarbon compounds. These fluorochemicals generally comprise from 2 to 16 carbon atoms and include, but are not limited to, linear, cyclic or polycyclic perfluoroalkanes, bis(perfluoroalkyl)alkenes, perfluoroethers, perfluoroalkyl amines, perfluoroalkyl bromides and perfluoroalkyl chlorides. One brand of fluorocarbon solvents is Fluorinert™ from 3M. The continuous phase may also be selected from silicone fluids such as polyphenylmethyl siloxanes, dimethyl polysiloxanes, polydimethyl siloxanes, cyclic dimethyl siloxanes and the like.

The continuous phase may also be a gel or highly viscous liquid.

The discontinuous phase is preferably non-aqueous. Where the discontinuous phase is non-aqueous it should be immiscible or substantially insoluble in the continuous phase.

The discontinuous phase may be a reagent of the types discussed above or it may be a solvent which carries the active chemical reagent. Alternatively the active chemical reagent may be a solid or insoluble liquid dispersed in the discontinuous phase.

The emulsions according to the invention may also include charge control agents as discussed above.

This then generally describes the invention but to assist with understanding in reference will now be made to several detailed processes but the invention is not limited to these processes.

Process of Manufacture of a DNA Array

The process of forming a DNA array according to the present invention may in one embodiment may comprise the following steps:

(a) Substrate. A planar substrate is selected which is in part a dielectric or photoconductor, that is, an electric charge can be formed or impressed to thereby form an electrostatic charge at a selected region or regions or to discharge an electric charge at the selected region or regions.

(b) Substrate preparation. Next binder molecules are covalently bonded onto the substrate. The binder molecules in general have one portion which is covalently joined to the surface of the substrate and a chemically removable portion or chemically de-protectable portion which on deprotection exposes reactive groups to which are attached linkers carrying a terminal chemically removable portion. Selective removal of this portion allows nucleosides in phosphoramidite form to be coupled to form the DNA oligonucleotides. The linker molecules have the function of extending the final assembled DNA oligonucleotide (the probe) off the surface of the substrate to thereby provide more efficient access to other test DNA molecules (the targets) such as fluorescent or other detector tagged single stranded DNA or RNA molecule families to promote hybridisation which is then followed by analysis of the bound fluorescent or other species directly. There may be some cases in which a DNA array may be built up directly onto a substrate without the use of a binder molecule.

(c) Substrate charging. The substrate has an electrostatic charge placed upon it. A number of known techniques exist for the placement of an electric charge onto a planar substrate such as use of a corona discharge, electron beam gun or by application by a donor roller. The electrical charge may be positive or negative.

(d) Array definition. The substrate is selectively illuminated to discharge the electric charge in a spatially selected array of sites to leave an electrostatic charge pattern. Alternatively the electrical charge may be dissipated on all portions of the substrate except those selected sites. Selective illumination may be by the use of pulsed, modulated, stepped or controlled lasers or various optical techniques such as the use of masks or transparencies and suitable focussing. Preferably the illumination does not include illumination in the short ultra-violet region of the spectrum because such radiation may be harmful to DNA, however, for other forms of array UV may be used. Alternatively a spatially selected array of sites may be selectively charged with or without masks.

(e) Pre-coating Step. Optionally the substrate can be coated with a thin layer of a liquid, such as that which forms the continuous phase of the emulsion which is applied in the next step. This pre-coat assists in preventing deposition in unwanted areas.

(f) De-protection step. The substrate is flooded with a charged liquid emulsion of the present invention which emulsion is insulative in its continuous phase and has a chemical de-protection reagent in solution in its charged discontinuous phase. The reagent is attracted to the charged locations electrostatically and reacts with the chemically removable portion (the protecting group) to remove that portion. The chemical de-protecting reagent is preferably a Lewis acid, an organic acid or an inorganic acid. The continuous phase of the emulsion is preferably a fluorochemical and the discontinuous phase is preferably an organic solvent. The surfactant is preferably a molecule of a perfluorocarbon and an organic compound in which the perfluorocarbon portion is soluble in the fluorochemical and the organic compound portion is soluble in the organic solvent. After allowing the reaction to occur the emulsion is then washed off with the assistance of a suitable solvent. It is also desirable that before the emulsion is washed off any de-protection agent remaining in the emulsion is neutralised to prevent it from reacting in non-desired parts of the array.

(g) Nucleoside coupling step. The substrate is then flooded with a reagent including a selected activated nucleoside in phosphoramidite form which becomes chemically coupled to the linker molecules where the chemically removable portion or protecting group has been removed in the previous de-protecting step. The selected nucleoside includes a chemically removable protecting group which protects the region until the next nucleoside is to be deposited at the region. Excess reagent is then removed.

(h) Capping step. A chemical capping process is used to place permanent caps (eg acetyl groups) onto any linker molecules which were previously de-protected but did not have a nucleoside coupled to them. This is a known step of the phosphoramidite process. Where the nucleoside addition step is expected to be complete or substantially complete this capping step may not be necessary.

(h) Oxidation step. The newly formed phosphite linkage is oxidised to the phosphate (phosphotriester) form to complete one cycle of synthesis. This again is a known step of the phosphoramidite process.

(i) Repetition. Steps (c) to (h) are repeated except that the selective illumination may be arranged differently to discharge a different array of regions or to leave charge on a different array of regions and the chemical removal step either removes a protection group from a binder molecule or from a protected previously deposited nucleotide. Repetition is carried on until perhaps 60 nucleotides or more are coupled to form DNA oligomers on a region or regions. This may require up to 240 cydes to ensure that at any one site in any one cycle any one of the four nucleotides A, C, G or T can be coupled. Longer oligomers may be synthesised.

While this solid phase combinatorial chemistry synthesis process has been discussed in relation to the phosphoramidite process it is to be realised that the process is also applicable to other processes which use a stepwise addition process with a chemical capping or de-protecting step or a chemical activation or deactivation step or derivatisation step.

It will be seen generally by this invention that there is provided an arrangement by which spatially selective chemical reactions such as the de-protecting of one or more DNA oligodeoxynucleotides being formed on an array or chip on a substrate is possible by selective application of the reagent in the discontinuous phase of an emulsion by the process of the present invention.

Another application of the present invention may be for the electroless deposition or autocatalytic deposition of metals.

Electroless deposition using the electrostatic charged emulsion spatial process of the present invention may be accomplished with either with a substrate which is a photoconductor with a chemically functional coat or alternatively the substrate could be glass or a chemically resistant polymer plastic. In the case of glass or plastics the surface could be electrostatically charged in a desired electrostatic pattern and the emulsion containing the chemical catalyst (EG a metal derivitive) or promoter in the discontinuous phase deposited according to the pattern. An alternative method of electrostatic charging could be to write to a dielectric substrate surface with a computer controlled electron beam. A further method could be to charge pattern a dielectric substrate surface using soft lithography. Soft lithography refers to a high resolution charging technique based on transferring a pattern from a conductive elastomeric stamp to a dielectric substance with conformational contact.

The process for the electroless deposition would involve the standard steps for electroless deposition with the exception that the catalyst or chemical used to trigger the electroless deposition would deposited onto the latent electrostatic image using the present invention. An example of a catalyst for deposition is a palladium activator. Other chemicals that are deposition promoters for various metals are formaldehyde, ethylenediamine, ethylenediamine adducted with propylene oxide, borohydride and amine borane systems. It may be noted that the majority of electroless deposition is done with proprietary electroless solutions from various suppliers either in the electroplating or the semiconductor industries. These companies usually incorporate proprietary ingredients such as wetting agents and additives that for instance control the grain size of the deposited electroless copper. These could also be included in the discontinuous phase of the emulsions of the present invention. Metals which may be deposited may include gold, copper, cobalt, nickel and silver.

Similarly electroless plating is used in the semiconductor industry for the deposition of circuitry and the present invention would be applicable to this technology as well.

This then generally describes the invention but to assist with understanding of the formation of a DNA array and the phosphoramidite process and the spatially selective deposition of the present invention reference will now be made to the accompanying drawings which show preferred embodiments of the invention.

BRIEF DESCRIPTION OF THE DRAWINGS

Now looking in more detail to the drawings FIG. 1 shows the basic principles of the present invention as applied to writing of a DNA chip. At stage 1 a substrate 10 is provided which has spacer molecules with a terminal protecting group all over its surface. The entire surface is electrostatically charged negative at stage 2 by the use of a corona discharge 12. Stage 2 shows an array of charged regions 13 on the substrate 10 all with a negative charge. A modulated laser 14 is then used in stage 3 to illuminate those sites where a first deposition is not required. This leaves an array of negatively charged probe cells or features 15 which are to be derivatised with a first nucleoside (eg A). The emulsion according to the invention is then applied to the substrate at stage 4. The emulsion has in its discontinuous phase droplets 16 which are charged positively and include an acid which removes the protecting group on the spacer molecules. The droplets 16 of the discontinuous phase are drawn to the electrostatically charged probe cells 15 and an acid mediated removal of protecting groups occurs in stage 5 which leaves reactive hydroxyls as shown in stage 6. At stage 6 a reactive amidite (eg A amidite) is then placed on the substrate and reaction occurs where the reactive hydroxyls are present. These reactive amidites each carry a terminal protecting group so that at stage 7 the first cycle is complete and the substrate is then covered with protecting groups ready for the next nucleoside (inamidite form) to be deposited in a selected array. There may be a run of up to 240 or more cycles of stages 1 to 7 to give a 60 mer or greater length oligodeoxynucleotide.

FIG. 2 shows the general structure of a DNA chip probe. The substrate 20 has on it a chemically functional layer 21 which include surface derivatisable groups 22 (X). Onto these derivatisable groups 22 surface binder, anchoring and/or functionalising groups 23 (Y) may be chemically bonded. From a functional group on these a linker and/or spacer group 24 may be joined. Onto the linker/spacer group the DNA 25 is built up as required.

FIG. 3 shows the various stages of the phosphoramidite process including that portion which is within the scope of the present invention. At stage 100 a substrate 101 is provided which has functionalised binders 102, spacer molecules 103 with terminal protecting groups 104 all over its surface. The entire surface is electrostatically charged negative at stage 105 and discharged to leave an array of predetermined negatively charged probe cells or features which are to be derivatised with a nucleoside. An emulsion according to the invention is then applied to the substrate at stage 107. The emulsion has in its discontinuous phase droplets 106 which are charged positively and include an acid which will remove the protecting group on selected spacer molecules. The droplets 106 of the discontinuous phase are drawn to the electrostatically charged probe cells at stage 108 and an acid mediated removal of protecting groups occurs 109 which leaves reactive hydroxyls as shown in stage 110. At stage 112 a reactive amidite 113 (eg A amidite) is then placed on the substrate and reaction occurs where the reactive hydroxyls are present. The linked nucleoside derivatives 114 each carry a terminal protecting group 115.

A chemical capping process 116 can then be used to place permanent caps (eg acetyl groups) onto any linker molecules which were previously de-protected but did not have a nucleoside coupled to them.

The newly formed phosphite linkage is oxidised to the phosphate (phosphotriester) form at stage 118 to complete one cycle of synthesis. The substrate is then completely covered with protecting groups ready for the next oligonucleotide to be deposited in a selected array. The process is then recycled to add second or subsequent bases to designated features bearing reactive hydroxyls generated by further stages 100, 105, 107, 108 and 110 using acid deprotection as discussed above. There may be a run of up to 240 or more cycles of these stages to give a 60 mer or greater length oligodeoxynucleotide.

Figure 1:
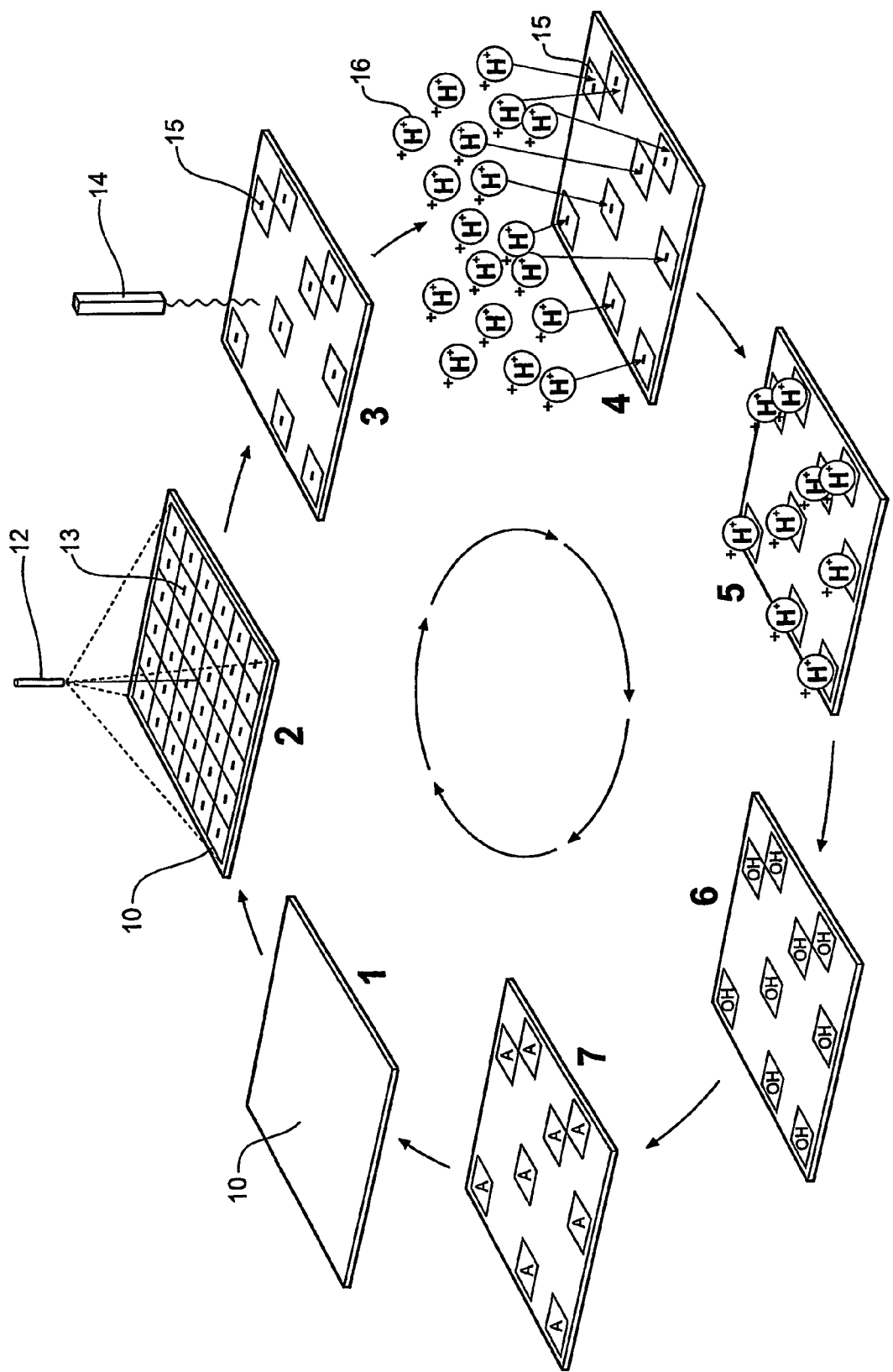
FIG. 1 shows the basic principles of the present invention as applied to writing of a DNA chip.
Figure 2:
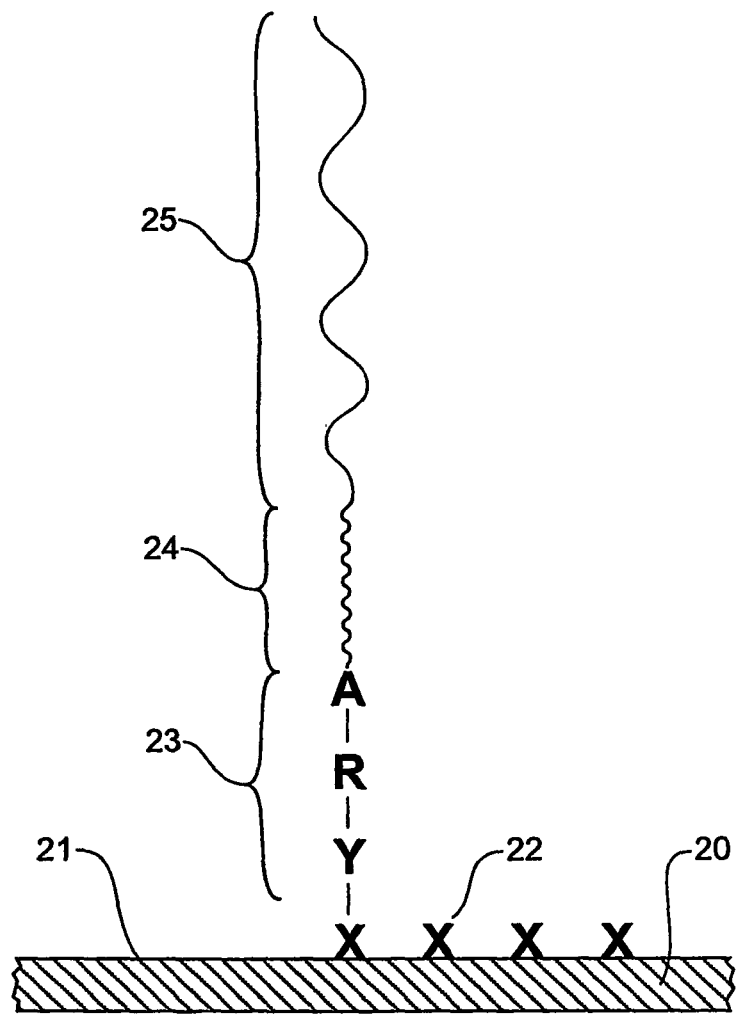
FIG. 2 shows the general structure of a DNA chip probe.
Figure 3:
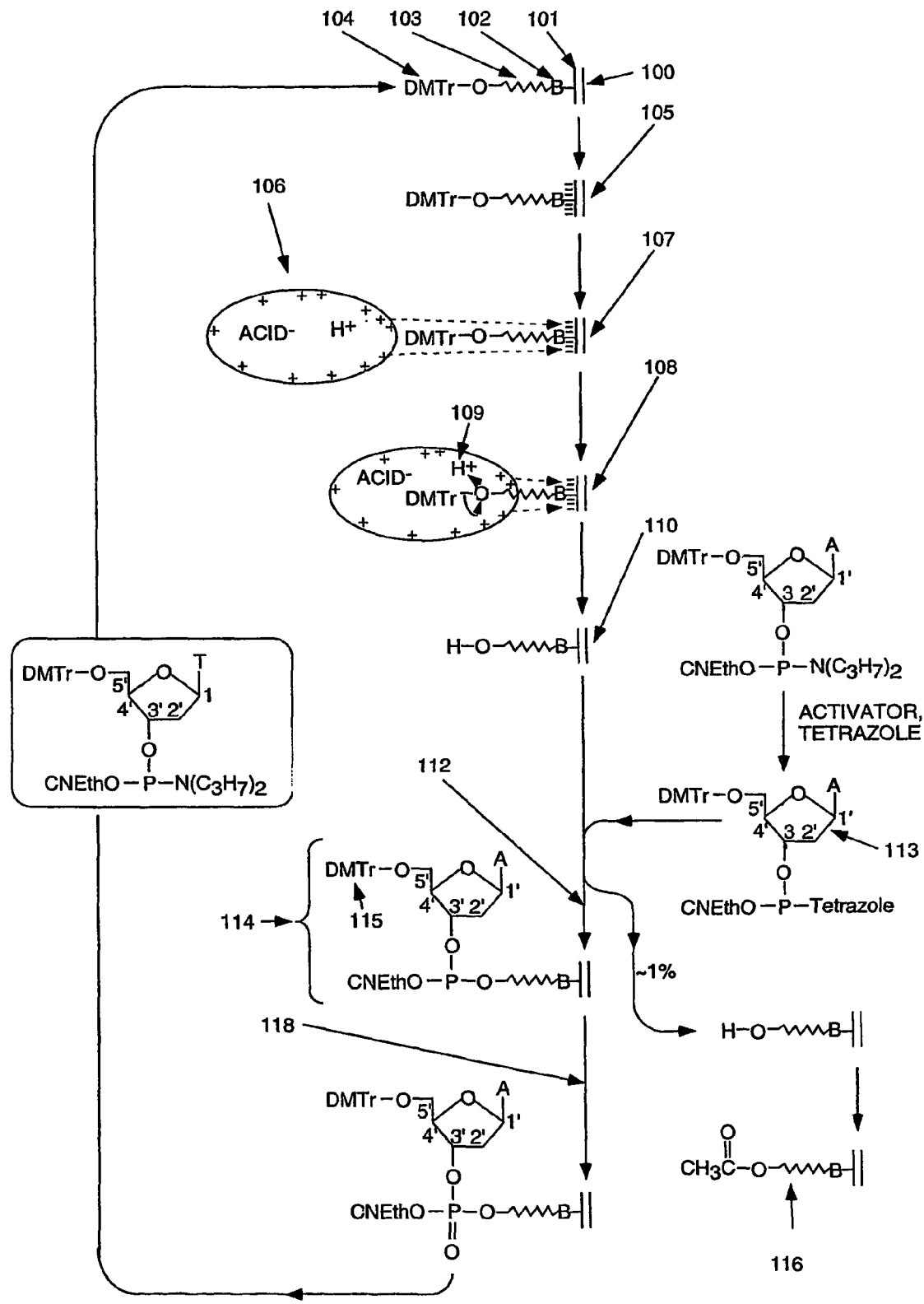
FIG. 3 shows the various stages of the phosphoramidite process.
Figure 4:
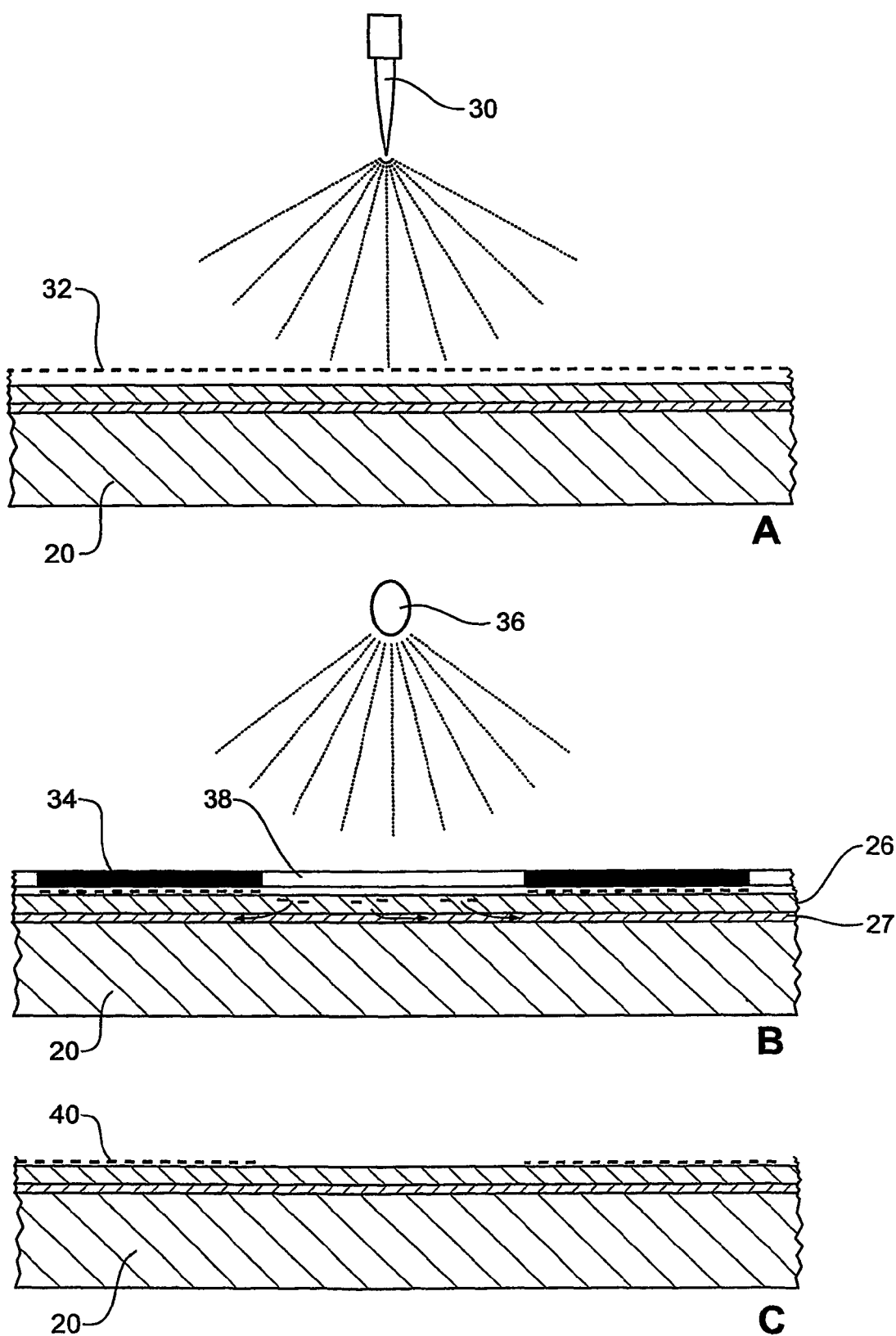
FIG. 4 shows one method by which a substrate according to the present invention may be charged for the deposition of chemicals using an emulsion.

FIG. 4 shows one method by which a substrate according to the present invention may be charged for the deposition of chemicals using an emulsion. In this arrangement the substrate 20 is charged with a single point corona discharge device 30 to give a uniform negative charge pattern 32 on the substrate (FIG. 4A). A mask 34 is then held over or placed onto the substrate and a light 36 shone onto the mask 34 (FIG. 4B). Where there are transparent portions 38 in the mask 34 the photoconductor layer 26 becomes conducting and the charge pattern in those areas is dissipated to the conductive layer 27. This leaves an electrostatic charge pattern 40 in the unexposed areas (FIG. 4C) and it is to these areas that the droplets of the discontinuous phase can be attracted in a subsequent deposition step if using an emulsion with positively charged droplets.

Figure 5:
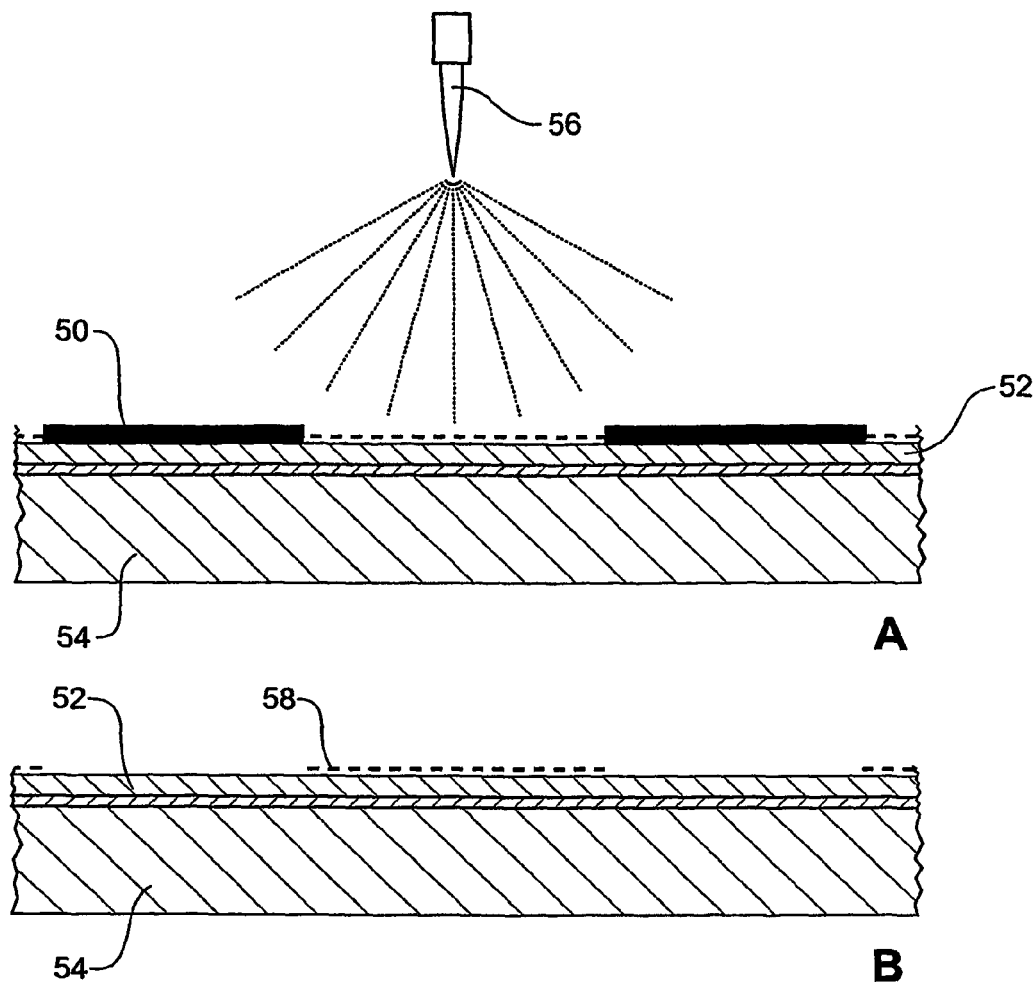
FIG. 5 shows an alternative method by which a substrate according to the present invention may be charged for the deposition of chemicals using an emulsion.

FIG. 5 shows an alternative method by which a substrate according to the present invention may be charged for the deposition of chemicals using an emulsion. In this arrangement the layer 52 is a dielectric material. A metal or other conducting mask 50 is held over or placed onto the substrate 54 and then the substrate is charged with a single point corona discharge device 56 (FIG. 5A). This gives a charge pattern 58 on the dielectric layer 52 of the substrate 54 in those areas in which there are apertures in the mask and it is to these areas that the droplets of the discontinuous phase are attracted (FIG. 5B).

Negatively charged emulsion droplets will deposit on areas of the surface where the negative charge is absent preferably with the assistance of a bias voltage plate.

Figure 6:
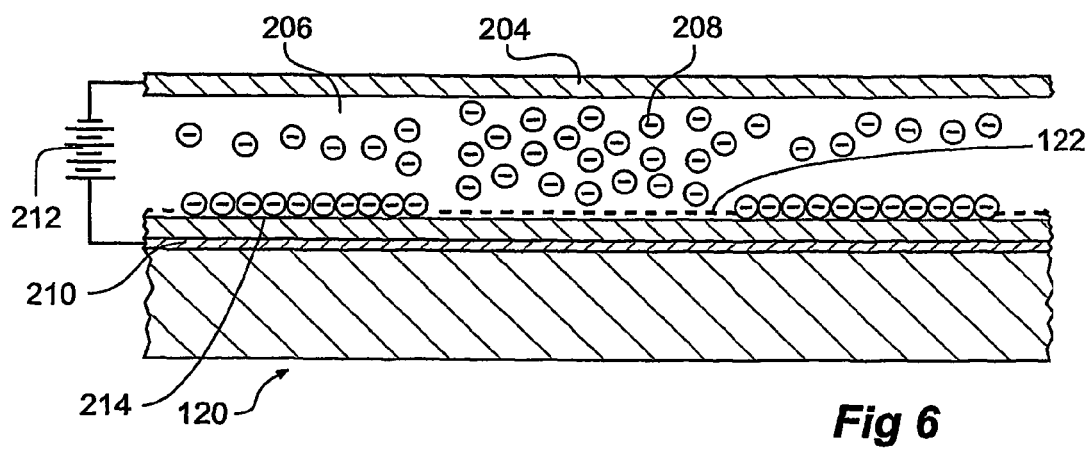
FIG. 6 shows one method by which deposition of chemicals using an emulsion onto a substrate according to the present invention may carried out.

This arrangement is shown in FIG. 6. In this case the substrate 120 has had negatively charged regions 122 formed upon it by the methods shown in FIGS. 4 and 5 for instance. A bias voltage plate 204 has been brought up to near the substrate 200 with an emulsion 206 with negatively charged droplets 208 in it. A negative voltage is placed onto the bias plate with respect to the conductive layer 210 by power supply 212. The negatively charged droplets 208 are forced down to the neutral regions 214 between the negatively charged regions 202. This process may be termed reversal deposition.

Figure 7:
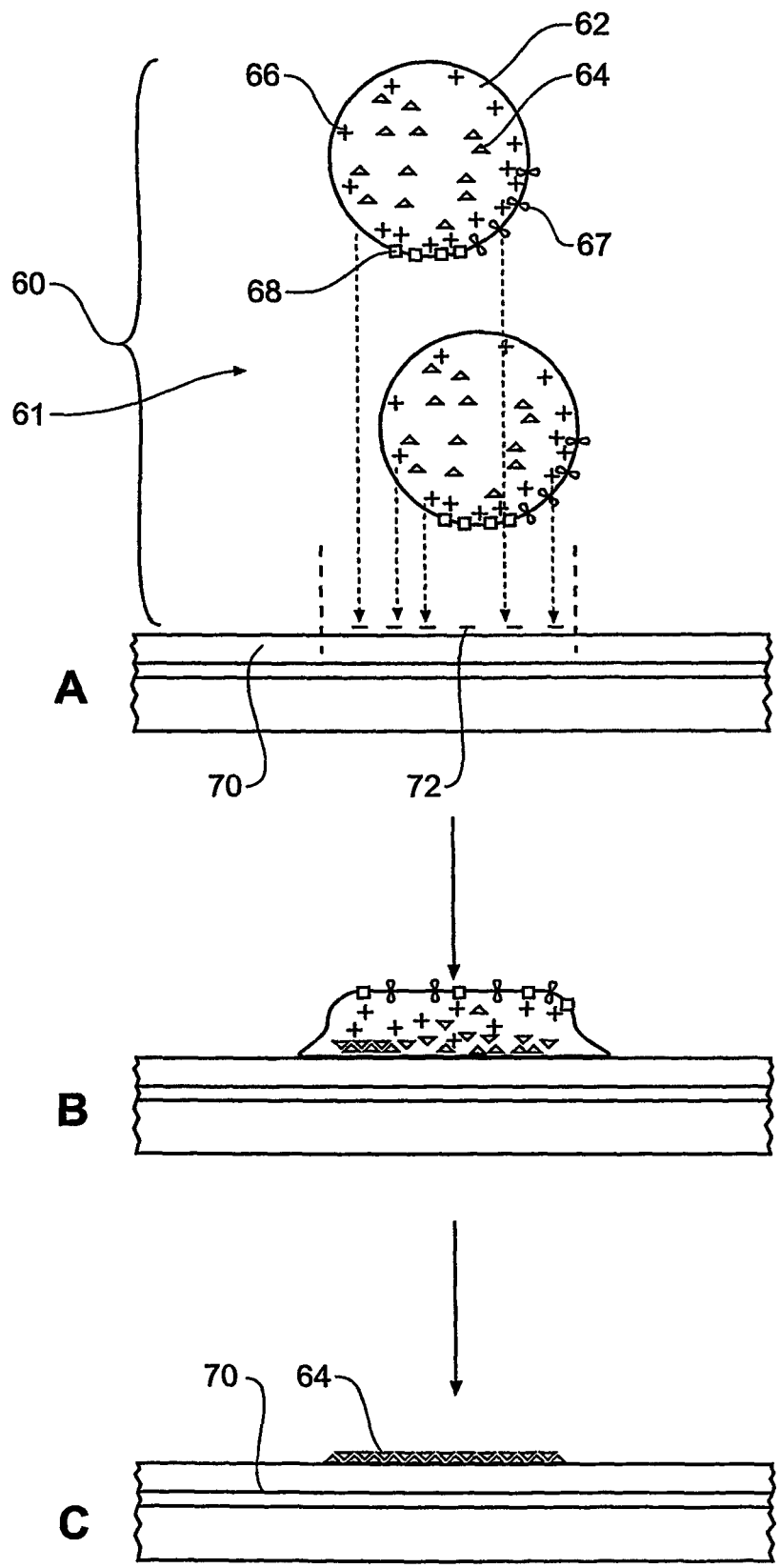
FIG. 7 shows detail of the nature of the function of emulsions of the present invention.

FIG. 7 shows detail of the nature of the function of emulsions of the present invention. The first stage shown in FIG.

7A shows emulsion 60 which consists of an electrically insulative continuous phase 61 and droplets 62 of a discontinuous phase. The droplets carry a chemical substance 64 to be deposited and carry a positive charge 66 which may be intrinsic with the droplets or supplied by a surfactant 67 or a charge control agent 68. The emulsion is placed onto a substrate 70 which has negatively charged regions 72. The positively charged droplets 62 are attracted to the negatively charged regions 72 on the substrate a shown in FIG. 7B and the chemical substance 64 deposits with or without reaction with the surface of the substrate. Excess emulsion can then be removed as shown in FIG. 7C to leave the deposited chemical substance 64 on the substrate 70.

Figure 8:
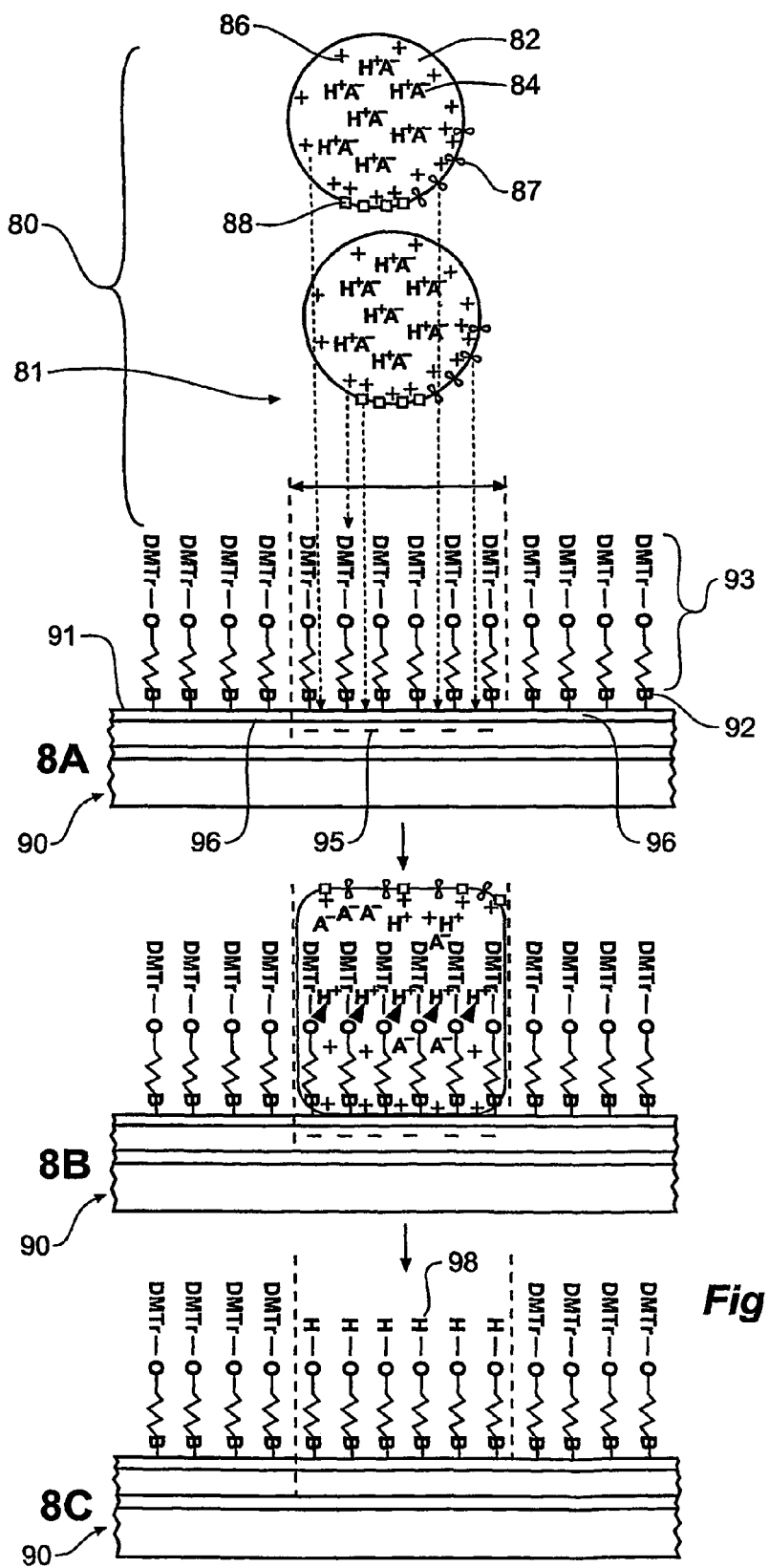
FIG. 8 shows detail of the nature of an emulsion mediated reaction on the surface of a substrate according to one embodiment of the present invention.

FIG. 8 shows detail of the nature of an emulsion mediated reaction on the surface of a substrate according to one embodiment of the present invention.

The first stage shown in FIG. 8A shows emulsion 80 which consists of an electrically insulative continuous phase 81 and droplets 82 of a discontinuous phase. The droplets carry an acid ($H^+A^-$) 84 for linker deprotection and carry a positive charge 86 which may be intrinsic with the droplets or supplied by a surfactant 87 or a charge control agent 88. The emulsion is placed onto a substrate 90 which has a chemically functional layer 91 to which is chemically bound over the entire surface of the substrate binder molecules (B) 92. Onto the binder molecules there is a protected linker 93. In this case the linker is protected by a dimethyloxytrityl (DMTr) group. The region designated 94 is a DNA chip cell or feature The surface of the substrate includes negatively charged regions 95 and neutral regions 96. The positively charged droplets 82 are attracted to the negatively charged regions 95 on the substrate a shown in FIG. 8B and the acid 84 in the droplets reacts with the protected linkers 93. The emulsion 80 can then be removed as shown in FIG. 8C to leave the reactive hydroxyls of the deprotected linkers 98 in the regions 95, which were previously negatively charged, on the substrate 90. The reactive hydroxyls of the deprotected linkers are then available for linkage to a DNA base for instance in the form of an activated phosphoramidite.

EXAMPLES

An experiment was carried out to determine whether a charged emulsion would deposit on an oppositely charged substrate with an electrostatic pattern formed thereon. For this purpose an emulsion was formed with an insulative continuous phase and a discontinuous phase which included an acid and a substrate comprising a zinc oxide photoconductor was charged with a negative pattern. The photoconductor was dip-coated with a solution of Butvar 72 (1% w/v) and the pH indicator methyl orange (at saturation) in cyclohexanone, and dried at 55 degrees C. for 30 minutes:

The emulsion comprised the following:

| | | |
|---|---|---|
| Continuous phase | FC40 | 0.89 ml |
| Discontinuous phase | 5% dichloroacetic acid (w/v) in toluene | 0.1 ml |
| | F6H14 (1% in FC40, v/v) | 0.01 ml |

F6H14 is a semifluorinated alkylalkane, 1-(perfluoro-n-hexyl) tetradecane, manufactured by Apollo Scientific Ltd, UK.

Zinc oxide photoconductor was supplied by Applied Research of Australia Pty Ltd and comprised zinc oxide bound with an insulative resin coated onto a PET aluminium metalised film.

It was found that the discontinuous phase deposited only in the area of the charge pattern, giving a pH-dependent colour change from yellow to pink.

This example shows firstly that the novel charged emulsions of the present invention are able to be selectively deposited onto a substrate.

Another experiment was carried out to determine whether a charged emulsion would deposit on an oppositely substrate charged with an electrostatic pattern formed thereon. For this purpose an emulsion was formed with an insulative continuous phase and a discontinuous phase which included a dye and polymer dissolved in the discontinuous phase so as to protect the dye from both water and air during and after deposition. A substrate comprising a zinc oxide photoconductor was charged in its entirety then covered with a mask before exposure to light so as to form a charge pattern that was a replica image of the mask.

The emulsion comprised the following:

| | | |
|---|---|---|
| Continuous phase | FC40 | 0.99 ml |
| Discontinuous phase | 1% Butvar 72 (w/v), 0.1% (w/v) crystal violet in DMSO | 0.005 ml |
| | 1% (w/v) Atlox 4912 in DMSO | 0.005 ml |

Crystal violet was supplied by George T. Gurr, Searle Scientific Services, Bucks, UK FC40 is a fluorocarbon solvent manufactured by 3M.

Butvar 72 is polyvinyl butyral manufactured by Solutia.

Atlox 4912 is a 12-hydroxystearic acid polyethylene glycol copolymer manufactured by the Uniqema business of ICI.

DMSO was supplied by Ajax Fine Chemicals, Australia

It was found that the discontinuous phase deposited only in the area of the charge pattern not exposed to light, giving a violet colouration.

In a further experiment comparable results were obtained when the emulsion composition comprised a continuous phase of FC40 and a discontinuous phase incorporating a polymer, AOT as surfactant and the pink fluorescent dye Rhodamine B.

The emulsion comprised the following:

| | | |
|---|---|---|
| Continuous phase | FC40 | 0.99 ml |
| Discontinuous phase | 1% Butvar 72 (w/v), 0.1% (w/v) Rhodamine B Both in DMSO | 0.005 ml |
| | 10% (w/v) AOT in DMSO | 0.005 ml |

Rhodamine B was supplied by Sigma Aldrich Chemical Co.

It was found that the discontinuous phase deposited only in the area of the charge pattern not exposed to light, giving a fluorescent pink colouration.

A further experiment was carried out to determine whether a charged emulsion would deposit on a substrate charged with an electrostatic field formed thereon using an alternative surfactant. Again the discontinuous phase included a dye and polymer dissolved in the discontinuous phase so as to protect the dye from both water and air during and after deposition. This models the requirements for dye protection in OLED manufacture. A substrate comprising a zinc oxide photoconductor was charged in its entirety then covered with a mask before exposure to light so as to form a charge pattern that was a replica image of the mask.

The emulsion comprised the following:

| Continuous phase | FC40 | 0.99 ml |
|---|---|---|
| Discontinuous phase | 1% Butvar 72 (w/v), 0.1% crystal violet (w/v) in DMSO | 0.005 ml |
| | 10% SDS in DMSO (w/v) | 0.005 ml |

SDS is sodium dodecyl sulphate, supplied by Sigma Aldrich Chemicals

It was found that the discontinuous phase deposited only in the area of the charge pattern not exposed to light, giving a violet colouration.

A further experiment was carried out to confirm that a charged emulsion would deposit on a substrate charged with an electrostatic field formed thereon, using an alternative surfactant. Again the discontinuous phase included a polymer dissolved with a dye in the discontinuous phase so as to protect the dye from both water and air during and after deposition. A substrate comprising a zinc oxide photoconductor was charged in its entirety then covered with a mask before exposure to light so as to form a charge pattern that was a replica image of the mask.

The emulsion comprised the following:

| Continuous phase | FC40 | 0.99 ml |
|---|---|---|
| Discontinuous phase | 1% Butvar 72 (w/v), 0.1% crystal violet (w/v) in DMSO | 0.005 ml |
| | 10% FC134 in DMSO (w/v) | 0.005 ml |

FC134 is a cationic surfactant of the general structure $R_fSO_2NHC_3H_6N^+(CH_3)_3I^-$, in which $R_f = C_nF_{2n+1}$ and n is predominantly 8.

It was found that the discontinuous phase deposited only in the area of the charge pattern not exposed to light, giving a violet colouration.

An experiment was carried out to demonstrate the deposition of gold from a charged emulsion onto an oppositely charged substrate, for the purpose of illustrating the potential role of this invention in the manufacture of flexible printed circuits. A solution of chloroauric acid ($AuCl_4.H$) was prepared in DMSO and emulsified in a continuous phase of FC-40. A substrate comprising a zinc oxide photoconductor was charged while covered with a mask so as to form a negative charge pattern on the photoconductor. After development of the latent image with the emulsion the photoconductor was heated for 15 minutes at 110 degrees C. to decompose the chloroauric acid to give metallic gold.

The emulsion comprised the following:

| Continuous phase | FC40 | 0.995 ml |
|---|---|---|
| Discontinuous phase | 10% chloroauric acid (w/v) in DMSO | 0.005 ml |

Selective deposition of the gold solution appeared as a purple pattern on the white photoconductor.

A further experiment was carried out to demonstrate the deposition of gold from a charged emulsion onto an oppositely charged substrate, for the purpose of illustrating the potential role of this invention in the manufacture of flexible printed circuits. A solution of chloroauric acid ($AuCl_4.H$) was prepared in DMSO and emulsified in a continuous phase of FC-40. A substrate comprising a glass coverslip coated with 0.1% Butvar 72 was charged while covered with a mask so as to form a negative charge pattern on the coverslip. After development of the latent image with the emulsion the coverslip was heated for 15 minutes at about 300 degrees C. to decompose the chloroauric acid to give metallic gold.

The emulsion comprised the following:

| Continuous phase | FC40 | 0.995 ml |
|---|---|---|
| Discontinuous phase | 10% chloroauric acid (w/v) in DMSO | 0.005 ml |

Selective deposition of the gold solution appeared as a purple pattern on the transparent coverslip, but after heating the pattern appeared gold in reflected light.

A further experiment was carried out to demonstrate the deposition of gold from a charged emulsion onto an oppositely charged substrate, for the purpose of illustrating the potential role of this invention in the manufacture of flexible printed circuits. A solution of chloroauric acid ($AuCl_4.H$) was prepared in DMSO and emulsified in a continuous phase of FC40. A substrate comprising a glass coverslip coated with 1% Butvar 72 was charged while covered with a mask so as to form a negative charge pattern on the coverslip. After development of the latent image with the emulsion the coverslip was heated for 15 minutes at about 300 degrees C. to decompose the chloroauric acid to metallic gold.

The emulsion comprised the following:

| Continuous phase | FC40 | 0.995 ml |
|---|---|---|
| Discontinuous phase | 10% chloroauric acid (w/v) in DMSO | 0.005 ml |

Selective deposition of the gold solution appeared as a purple pattern on the transparent coverslip, but after heating the pattern appeared gold in reflected light.

Further experiments were carried out showing:
- that the presence of oligodeoxynucleotides (with chemical blocking groups on) on a dielectric surface do not prevent it from accepting a charge pattern;
- that a pre-made oligodeoxynudeotide, (with blocking groups removed) can be deposited in a spatially defined pattern without affecting volume resistivity;
- that a photoconductor surface can be modified so as to have chemicals (oligodeoxynucleotides) bonded to it in spatially defined patterns.

In an experiment to demonstrate that the presence of in situ synthesised oligodeoxynucleotides on a surface would not compromise the ability of that surface to hold a charge pattern, images were formed on glass surfaces on which had been synthesised oligodeoxynucleotides comprising $(dT)_{12}$ (SEQ ID NO:1) and $(dT)_{25}$ (SEQ ID NO:1). Glass coverslips (24 mm×50 mm×0.13 mm) were sandwiched into a reaction chamber comprising a front of Perspex™ and a back of polypropylene. The volume of the chamber (0.2 ml to 0.4 ml) was defined by gaskets cut from silicon rubber sheet with holes machined through the polypropylene to enable entry and exit of reagents. Entry and exit ports were designed so that the reaction block could be fitted in-line in an Applied Biosystems 394 DNA/RNA synthesiser, in place of a standard oligo-synthesis column.

Coverslips were cleaned in a solution containing 0.1% Pyroneg™, 1% NaOH and 10% ethanol, rinsed exhaustively with Milli Q™ water, before being dried at 110 degrees C. immediately prior to use. For synthesis of a silane chemically functional layer, coverslips were immersed in a solution of 5% v/v glycidoxypropyl trimethoxysilane in toluene for 30 minutes at room temperature, rinsed with toluene and baked at 110 degrees C. for 30 minutes. The glycidoxy ring was opened to facilitate reaction with phosphoramidites by incubation in 0.5 M HCl for 30 minutes. Once in the reaction chamber, coverslip surfaces were subjected to standard synthesis cycles of the ABI 394 for synthesis of $(dT)_{12}$ (SEQ ID NO:1) and $(dT)_{25}$ (SEQ ID NO:1).

On removal from the reaction chamber charge patterns were formed on the coverslips using a single point corona and mask and the charge patterns were developed using a particulate electrostatic liquid toner. The presence of strong images in the regions on which the $(dT)_{12}$ (SEQ ID NO:1) and $(dT)_{25}$ (SEQ ID NO:1) oligomers had been synthesised confirmed that their presence did not compromise the ability of the dielectric surface to hold a charge pattern.

Further experiments demonstrated that pre-made oligodeoxynucleotides could be incorporated into emulsions and be deposited in pre-determined patterns, confirming that their presence in an emulsion would not interfere with the volume resistivity of the continuous phase, and that they would react chemically with the surface to bind there.

A 29-mer dye-labelled amino oligodeoxynudeotide of base sequence comprising in part the phage lambda single stranded tail was purchased from GeneWorks (Thebarton, South Australia), dissolved at 188 mM in Milli Q water and emulsified as a 0.6% (v/v) discontinuous phase in FC40 with Triton X-100 (0.0003% final, w/v) using an ultrasonic probe. A charge pattern was formed on an Eppendorf "Creative CreativeChip® Oligo slide (Eppendorf, Germany) using a single point corona and mask, emulsion applied to the latent image on it and left briefly to drain and dry. Coupling of the oligodeoxynudeotide to the epoxy slide was then done according to manufacturer's instructions, and its presence in the form of the mask pattern confirmed by scanning the slide in a GenePix 4000B (Axon Instruments Inc., Australia)

A similar experiment was done using cadmium sulphide photoconductor on stainless steel support. The surface of the cadmium sulphide was first silanised with mercaptopropyl trimethoxysilane, then with glycidoxypropyl trimethoxysilane (both from Sigma-Aldrich Inc), and ring-opened with 0.5M HCl (as above). The modified cadmium sulphide was charged negatively through a mask using a multipin corona discharge in darkness to create a latent image on its surface. An emulsion of the same composition as in the previous example was deposited on the surface, and subjected to the "coupling" procedure recommended by Eppendorf for its CreativeChip® Oligo slides. Coupling of the oligodeoxynucleotide to the slide was confirmed by scanning the slide in a GenePix 4000B (Axon Instruments Inc.), and identifying the mask pattern of oligodeoxynucleotides coupled chemically onto the photoconductor surface.

One embodiment of this invention is in the spatially directed detritylation of the terminal nucleotide of oligodeoxynudeotides being synthesized in situ by combinatorial chemistry. Removal of the trityl protecting group (detritylation) from particular oligodeoxynudeotides at defined locations (termed features or cells) on the surface of a DNA chip generates reactive hydroxyl groups. These hydroxyl groups provide the sites for chemical binding of the next nucleoside (in phosphoramidite form) to be added to the extending oligodeoxynucleotide strand. In this manner the spatially directed detritylation of this invention provides an alternative means of determining where (at the micro and nano scale) the standard phosphoramidite synthesis for oligodeoxynucleotides will be applied, for the manufacture of an array of diverse oligodeoxynucleotides on a DNA chip such as may be used in determining patterns and levels of gene expression in biological samples, e.g. for clinical diagnosis of diseases.

Two examples are presented here to show how this invention has been applied for spatially directed detritylation of protected deoxynucleotide phosphoramidites.

Example 1

A strip of zinc oxide photoconductor was doped with a 50 mM solution of deoxyadenosine-phosphoramidite (dimethyltrityl-protected) in anhydrous acetonitrile, and dried at 55 degrees C. for 30 minutes. A ditritylation emulsion was prepared as follows:

| Continuous phase: | FC-40 | 0.99 ml |
| Discontinuous phase | 50% (w/w) zinc bromide in tetrahydrofuran | 0.01 ml |

These components were emulsified by sonication for 4 seconds at power setting 4 using the ¼"¼ inch probe of the Sonics & Materials Vibra-cell Model CV-17 probe system (USA). An aliquot was applied to the amidite-doped zinc oxide strip after it had been charged negatively, and a latent charge pattern formed on it by subsequent illumination through a mask. The strip was pre-wet with FC-40 immediately prior to applying the emulsion across its surface. Patterned detritylation was observed as the formation of the intensely orange dimethoxytrityl cation, generated as a result of deprotection of the amidite. The droplets of this detritylation emulsion were positively charged, as indicated by the way in which the emulsion droplets carrying the Lewis acid zinc bromide were deposited in zones not exposed to illumination (such zones thereby retaining their negative charge).

Example 2

A borosilicate glass coverslip (24 mm×50 mm×0.13 mm) was cleaned with chromic acid, and derivatized with 3-aminopropyltrimethoxysilane (APS) by 15 min incubation in 5% (v/v) APS in toluene that had been left to stand for 15 min on mixing to permit prior hydrolysis of the methoxy groups. After a further 15 min rinse in toluene the coverslip was dried at 110 degrees C. for 60 min.

The coverslip was then sandwiched into a reaction chamber comprising a front of Perspex™ and a rigid back of polypropylene. The volume of the chamber (0.25 ml) was defined by a Viton™ "O"-ring, with holes machined through the polypropylene to enable entry and exit of reagents. Entry and exit ports were designed so that the reaction block could be fitted in line in an Applied Biosystems 394 DNA synthesiser, in place of a standard oligo-synthesis column.

Manual coupling of phosphoramidite to the coverslip followed a protocol adapted from that described in Technical Bulletin TL1002 of TriLink BioTechnologies (USA), using synthesis reagents supplied specifically for the ABI 394 DNA synthesiser. The coverslip was first rinsed in situ with 5 ml of anhydrous acetonitrile. Activated dA amidite reagent (0.4 ml) was then passed across it for about 2 min, followed by a second rinse with 5 ml anhydrous acetonitrile. Next, 1 ml oxidizing solution was pulsed across the surface of the coverslip over about 1 min, before being rinsed off with another 5 ml anhydrous acetonitrile.

The coverslip, now carrying the dimethoxytrityl group on the dT nucleotide bound to the surface through the aminosilane, was removed from the reaction chamber, and with this derivatized surface face-up, was given a latent image of negative charge by means of single point corona discharge through a patterned mask. The coverslip was pre-wet with FC-40 prior to brief exposure to an emulsion of the same composition as that in the previous example.

Spatially directed detritylation was observed in the form of a coloured pattern, as the Lewis acid contained in the emulsion droplets reacted with the protecting groups to release intensely orange dimethoxytrityl cations. The coloured pattern matched that of holes in the mask, indicating that emulsion droplets were positively charged and had been attracted to negatively charged regions of the derivatized surface. A "print" of the detritylation pattern was made by overlaying the coloured detritylation image with a cellulose acetate Sepraphore III electrophoresis membrane (Gelman Sciences, USA), thereby adsorbing the pattern onto the membrane.

Emulsions tested in the above experiments were prepared using ultrasonic generators. This is achieved by the following equipment.

Sonics and Materials Vibra-cell Model CV-17 Probe System:
Power 600 watts, used for emulsification ¼" sonicator probe, controlled power and timed output.

Throughout this specification various indications have been given as to the scope of this invention but the invention is not limited to any one of these but may reside in two or more of these combined together. The examples are given for illustration only and not for limitation.

Throughout this specification and the claims that follow unless the context requires otherwise, the words 'comprise' and 'include' and variations such as 'comprising' and 'including' will be understood to imply the inclusion of a stated integer or group of integers but not the exclusion of any other integer or group of integers.

tinuous phase and an electrically charged discontinuous phase and a component to be selectively deposited carried in the discontinuous phase, the emulsion comprising a surfactant, the surfactant having a first part which is compatible with the non-aqueous continuous phase and a second part which is compatible with the discontinuous phase, the surfactant being selected to not significantly reduce the volume resistivity of the non-aqueous continuous phase, wherein the emulsion protects from both water and air, and (c) directing the discontinuous phase of the emulsion to the at least one region by attraction to or repulsion from the electrostatic charge on the region,
wherein the substrate comprises:
a support,
a conductive layer on the support,
a dielectric layer of a material which will hold an electric charge disposed on the conductive layer, and
a chemically functional layer on the dielectric layer.

2. A method as in claim 1 wherein the component to be selectively deposited is selected from the group consisting of a bio-active agent, an activated nucleoside amidite (A, C, G or T), an activated oligonucleotide, a reagent or reactant further including acids and bases, a blocking chemical, a de-blocking chemical, an organic or inorganic derivatisation chemical, a catalyst, a pharmaceutical, a dye or a pigment.

3. A method as in claim 1 further including the step of carrying out repetition of steps (a) to (c) to provide a stepwise deposition process at the same or alternative positions on the substrate and to achieve combinatorial synthesis on the substrate.

The claims defining the invention are as follows:

1. A method of manufacture by micrometer and nanometer scale spatially selective deposition of chemical substances on a substrate, the method including the steps of:
   (a) defining at least one region on the substrate by forming an electrostatic charge on that region which is different from the electrostatic charge on other regions of the substrate,
   (b) applying an emulsion to the substrate, the emulsion including an electrically insulative non-aqueous con- 4. A method as in claim 1 wherein the surfactant is selected from the group consisting of anionic, cationic, non-ionic or amphoteric compounds, polymer surfactant materials or phospholipids or fluorinated analogues of these.

5. A method as in claim 1 wherein the support is selected from the group consisting of metal, glass, ceramic, or polymeric material.

6. A method as in claim 1 wherein the conductive layer is selected from the group consisting of a sputtered layer of metal, indium tin oxide, or a quaternary ammonium salt.

7. A method as in claim 1 wherein the dielectric layer is selected from the group consisting of glass, a polymeric resin, zinc oxide, cadmium sulphide, amorphous selenium, an alloy of selenium selecting from the group consisting of selenium-tellurium, lead selenide, selenium-arsenic; and polyvinylcarbazole (PVK).

8. A method as in claim 1 wherein the dielectric layer is a photoconductive layer.

9. A method of manufacture by micrometer and nanometer scale spatially selective deposition of chemical substances on a substrate, the method including the steps of:
(a) defining at least one region on the substrate by forming an electrostatic charge on that region which is different from the electrostatic charge on other regions of the substrate,
(b) applying an emulsion to the substrate, the emulsion including an electrically insulative non-aqueous continuous phase and an electrically charged discontinuous phase and a chemical reagent to participate in forming a solid phase array carried in the discontinuous phase, the emulsion comprising a surfactant, the surfactant having a first part which is compatible with the non-aqueous continuous phase and a second part which is compatible with the discontinuous phase, the surfactant being selected to not significantly reduce the volume resistivity of the non-aqueous continuous phase, wherein the emulsion protects from both water and air,
(c) depositing the discontinuous phase of the emulsion to the at least one region by attraction by the electrostatic charge on the region,
(d) causing a chemical or physical reaction in the at least one region, and
(e) removing the emulsion,
wherein the substrate comprises:
a support,
a conductive layer on the support,
a dielectric layer of a material which will hold an electric charge disposed on the conductive layer, and
a chemically functional layer on the dielectric layer.

10. A method as in claim 9 further including the step of carrying out repetition of steps (a) to (e) to provide a stepwise deposition process at the same or alternative positions on the substrate.

11. A method as in claim 9 further including the step of flooding with a further reagent wherein reaction of the further reagent only occurs where the spatially selective deposition had previously occurred.

12. A method as in claim 11 wherein the step of applying the emulsion to the substrate includes the step of applying a coating to the substrate of the liquid of the non-aqueous continuous phase or other liquid before applying the emulsion.

13. A method as in claim 9 wherein the surfactant is selected from the group consisting of anionic, cationic, non-ionic or amphoteric compounds, polymer surfactant materials or phospholipids or fluorinated analogues of these.

14. A method as in claim 9 wherein the support is selected from the group consisting of metal, glass, ceramic, or polymeric material.

15. A method as in claim 9 wherein the conductive layer is selected from the group consisting of a sputtered layer of metal, indium tin oxide, a quaternary ammonium salt.

16. A method as in claim 9 wherein the dielectric layer is selected from the group consisting of glass, a polymeric resin, zinc oxide, cadmium sulphide, amorphous selenium, an alloy of selenium selecting from the group consisting of selenium-tellurium, lead selenide, selenium-arsenic; and polyvinylcarbazole (PVK).

17. A method as in claim 9 wherein the depositing the discontinuous phase of the emulsion to the at least one region is by attraction by the electrostatic charge on the region and by the use of bias voltage to reduce deposition in non-required regions.

18. A method of forming a solid phase chemical array on a substrate using a stepwise reaction process, the method including the steps of:
(a) defining at least one region on the substrate by forming an electrostatic charge on that region which is different from the electrostatic charge on other regions of the substrate,
(b) applying an emulsion to the substrate, the emulsion including an electrically insulative non-aqueous continuous phase and an electrically charged discontinuous phase and a chemical reagent carried in the discontinuous phase, the emulsion comprising a surfactant, the surfactant having a first part which is compatible with the non-aqueous continuous phase and a second part which is compatible with the discontinuous phase, the surfactant being selected to not significantly reduce the volume resistivity of the non-aqueous continuous phase, wherein the emulsion protects from both water and air,
(c) depositing the discontinuous phase of the emulsion to the at least one region by attraction by the electrostatic charge on the region,
(d) causing a chemical reaction in the at least one region,
(e) removing the emulsion, and
(f) carrying out subsequent steps of the stepwise reaction process,
wherein the substrate comprises:
a support,
a conductive layer on the support,
a dielectric layer of a material which will hold an electric charge disposed on the conductive layer, and
a chemically functional layer on the dielectric layer.

19. A method as in claim 18 wherein the surfactant is selected from the group consisting of anionic, cationic, non-ionic or amphoteric compounds, polymer surfactant materials or phospholipids or fluorinated analogues of these.

20. A method as in claim 18 wherein the support is selected from the group consisting of metal, glass, ceramic, or polymeric material.

21. A method as in claim 18 wherein the conductive layer is selected from the group consisting of a sputtered layer of metal, indium tin oxide, a quaternary ammonium salt.

22. A method as in claim 18 wherein the dielectric layer is selected from the group consisting of glass, a polymeric resin, zinc oxide, cadmium sulphide, amorphous selenium, an alloy of selenium selecting from the group consisting of selenium-tellurium, lead selenide, selenium-arsenic; and polyvinylcarbazole (PVK).

23. A method as in claim 18 wherein the depositing the discontinuous phase of the emulsion to the at least one region is by attraction by the electrostatic charge on the region and by the use of bias voltage to reduce deposition in non-required regions.

24. A method of forming a DNA array on a substrate using a stepwise coupling process with a chemical de-protecting step prior to each coupling step, the method including the steps of:

(a) preparing a substrate with surface functional groups protected by a removable protecting group;

(b) defining at least one region on the substrate by forming an electric field on that region which is different from the electric field on other regions of the substrate, (c) applying an emulsion to the substrate, the emulsion including an electrically insulative non-aqueous continuous phase and an electrically charged discontinuous phase and a chemical de-protecting reagent carried in the discontinuous phase, the emulsion comprising a surfactant, the surfactant having a first part which is compatible with the non-aqueous continuous phase and a second part which is compatible with the discontinuous phase, the surfactant being selected to not significantly reduce the volume resistivity of the non-aqueous continuous phase, wherein the emulsion protects from both water and air, (d) depositing the discontinuous phase of the emulsion to the at least one region by attraction by the electric field on the region, (e) causing chemical de-protecting in the at least one region, (f) removing the emulsion, and (g) carrying out subsequent steps of the stepwise coupling process, wherein the substrate comprises:
a support,
a conductive layer on the support,
a dielectric layer of a material which will hold an electric charge disposed on the conductive layer, and
a chemically functional layer on the dielectric layer.

25. A method as in claim 24 wherein the subsequent steps of the stepwise coupling process are those in the phosphoramidite chemistry for synthesis of oligodeoxynucleotides.

26. A method as in claim 24 wherein the non-aqueous continuous phase of the emulsion comprises a volume resistivity of approximately $1 \times 10^6$ ohm-cm or greater.

27. A method as in claim 24 wherein the non-aqueous continuous phase of the emulsion is selected from the group consisting of hydrocarbons; mixtures of hydrocarbons; fluorochemicals; silicone fluids.

28. A method as in claim 24 wherein the non-aqueous continuous phase of the emulsion is a gel or highly viscous liquid.

29. A method as in claim 24 wherein the discontinuous phase of the emulsion is non-aqueous and is immiscible or substantially insoluble in the non-aqueous continuous phase.

30. A method as in claim 24 wherein the discontinuous phase of the emulsion is selected from the group consisting of a reagent, a solvent which carries an active chemical reagent or a carrier liquid for a solid or insoluble liquid dispersed in the discontinuous phase.

31. A method as in claim 24 wherein the discontinuous phase of the emulsion is selected from the group consisting of acetone, acetonitrile, cyclohexanone, dibromomethane, dichloromethane (methylene chloride, DCM), trichloromethane, dioxane, 1,2-dichloroethane (DCE), nitromethane, tetrahydrofuran, toluene, decalin, dimethyl formamide, isobutanol, propylene carbonate, dimethyl sulphoxide, mixtures of hydrocarbons or mixtures of compounds selected from the group consisting of isopropanol/methylene chloride, nitromethane/methanol, nitromethane/isopropanol, trichloromethane/methanol or isopropanol/methylene chloride.

32. A method as in claim 24 wherein the emulsion further includes a charge control agent.

33. A method as in claim 32 wherein the charge control agent is selected from the group consisting of an inorganic acid and its salts, an organic acid and its salts or an ionic or zwitterionic compound.

34. A method as in claim 32 wherein the charge control agent is selected from the group consisting of metallic soaps, further comprising a metal and an acid wherein the metal is selected from barium, calcium, magnesium, strontium, zinc, cadmium, aluminium, gallium, lead, chromium, manganese, iron, nickel, zirconium and cobalt and the acid portion is a carboxylic acid, caproic acid, octanoic (caprylic) acid, capric acid, lauric acid, myristic acid, palmitic acid, stearic acid, oleic acid, linolic acid, erucic acid, tallitic acid, resinic acid, naphthenic acid and succinic acid; a phospholipid or alkyl succinimide.

35. A method as in claim 24 wherein the emulsion comprises the non-aqueous continuous phase present in the range of about 20 to 99.99 per cent by volume, the discontinuous phase present in a range of from about 0.01 to 80 per cent by volume.

36. A method as in claim 35 wherein the emulsion further comprises a surfactant present in a range of about 0.01 to 20 per cent by weight.

37. A method as in claim 35 wherein the emulsion further comprises a charge control agent present in a range of 0.01 to 10 per cent by weight.

38. A method as in claim 24 wherein the emulsion comprising the discontinuous phase has a droplet size of from about 100 microns down to 0.2 microns.

39. A method as in claim 24 wherein the emulsion is a miniemulsion with the discontinuous phase having a droplet size from 500 nanometers down to about 50 nanometers.

40. A method as in claim 24 wherein the emulsion comprises a microemulsion with the discontinuous phase having a droplet size of from about 200 nanometers down to 1 nanometer.

41. A method as in claim 24 wherein the step of defining at least one region on the substrate by forming an electrostatic charge on that region includes the step of image reversal to enable deposition in non-charged regions.

42. A method as in claim 24 wherein the step of formation of the electrostatic image pattern is by electrostatic means wherein the substrate is a photoconductor and the formation of the electrostatic field is by charging and subsequent discharging by selective illumination.

43. A method as in claim 24 wherein the step of removing the emulsion includes the step of neutralising any residual chemical de-capping agent in the emulsion to prevent it from reacting in non-desired parts of the array.

44. A method as in claim 24 wherein the chemical deprotection reagent is selected from the group consisting of Lewis acids, protic acids, zinc bromide, titanium tetrachloride, and ceric ammonium nitrate, dilute mineral acids, trichloroacetic acid (TCA), dichloroacetic acid (DCA), benzenesulphonic acid, trifluoroacetic acid (TFA), difluoroacetic acid, perchloric acid, orthophosphoric acid, toluenesulphonic acid, dodecylbenzene sulphonic acid and diphenyl acid phosphate.

45. A method as in claim 24 wherein the surfactant is selected from the group consisting of anionic, cationic, nonionic or amphoteric compounds, polymer surfactant materials or phospholipids or fluorinated analogues of these.

46. A method as in claim 24 wherein the support is selected from the group consisting of metal, glass, ceramic, or polymeric material.

47. A method as in claim 24 wherein the conductive layer is selected from the group consisting of a sputtered layer of metal, indium tin oxide, or a quaternary ammonium salt.

48. A method as in claim 24 wherein the dielectric layer is selected from the group consisting of glass, a polymeric resin, zinc oxide, cadmium sulphide, amorphous selenium, an alloy of selenium selected from the group consisting of selenium-tellurium, lead selenide, selenium-arsenic; and polyvinylcarbazole (PVK).

49. A method as in claim 24 wherein the depositing the discontinuous phase of the emulsion to the at least one region is by attraction by the electrostatic charge on the region and by the use of bias voltage to reduce deposition in non-required regions.

* * * * *

UNITED STATES PATENT AND TRADEMARK OFFICE
CERTIFICATE OF CORRECTION

PATENT NO.        : 8,431,344 B2
APPLICATION NO. : 10/562369
DATED             : April 30, 2013
INVENTOR(S)       : Hastwell et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this
Eighth Day of September, 2015

Michelle K. Lee
*Director of the United States Patent and Trademark Office*